United States Patent
Seo et al.

(10) Patent No.: US 7,507,616 B2
(45) Date of Patent: Mar. 24, 2009

(54) METHOD OF MANUFACTURING A FLEXIBLE THIN FILM TRANSISTOR ARRAY PANEL INCLUDING PLASTIC SUBSTRATE

(75) Inventors: Jong-Hyun Seo, Seoul (KR); Tae-Young Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 377 days.

(21) Appl. No.: 11/325,156

(22) Filed: Jan. 3, 2006

(65) Prior Publication Data

US 2006/0148141 A1 Jul. 6, 2006

(30) Foreign Application Priority Data

Jan. 3, 2005 (KR) .................. 10-2005-0000173

(51) Int. Cl.
*H01L 21/84* (2006.01)
(52) U.S. Cl. ................. 438/158; 438/164; 438/734; 438/749; 257/E21.7
(58) Field of Classification Search ............. 438/734, 438/749
See application file for complete search history.

(56) References Cited

U.S. PATENT DOCUMENTS

| | | | |
|---|---|---|---|
| 5,856,858 A * | 1/1999 | Carey et al. ............. | 349/158 |
| 6,176,290 B1 | 1/2001 | Hsu | |
| 2001/0041394 A1 * | 11/2001 | Park et al. ............. | 438/151 |
| 2004/0183955 A1 * | 9/2004 | Souk et al. ............. | 349/43 |
| 2004/0195571 A1 * | 10/2004 | Ahn et al. ............. | 257/72 |

FOREIGN PATENT DOCUMENTS

| | | |
|---|---|---|
| JP | 05041354 | 2/1993 |
| JP | 10091097 | 4/1998 |
| JP | 2001272929 | 10/2001 |
| KR | 1020030053040 | 6/2003 |
| KR | 1020030080626 | 10/2003 |
| KR | 1020030085894 | 11/2003 |

* cited by examiner

*Primary Examiner*—Stephen W Smoot
(74) *Attorney, Agent, or Firm*—Cantor Colburn LLP

(57) ABSTRACT

A method of manufacturing a flexible display is provided, which includes forming a gate line including a gate electrode on a substrate, sequentially depositing a gate insulating layer covering the gate line, and a semiconductor layer, firstly etching the semiconductor layer; secondly etching the semiconductor layer, forming a data line including a source electrode, and a drain electrode on the semiconductor layer and the gate insulating layer; and forming a pixel electrode connected to the drain electrode.

19 Claims, 35 Drawing Sheets

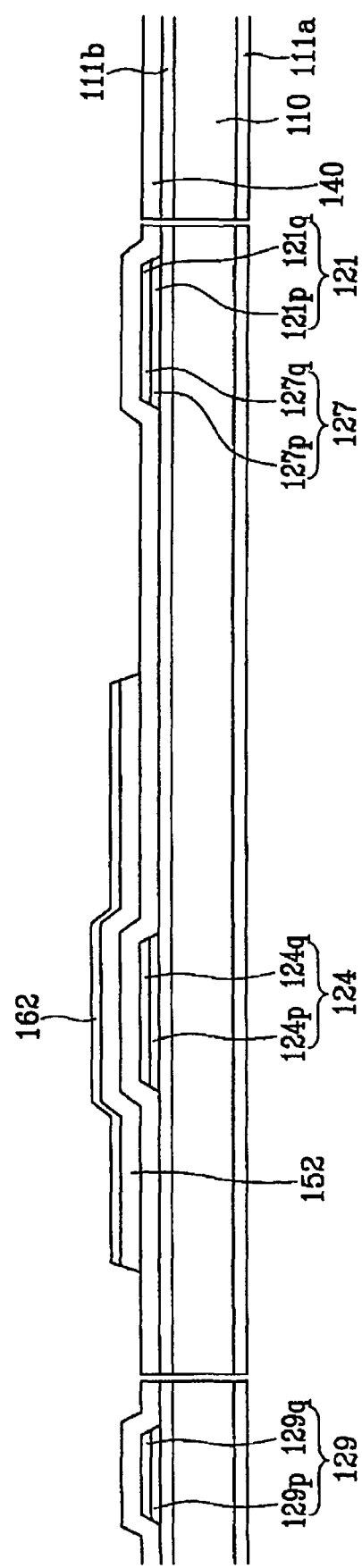

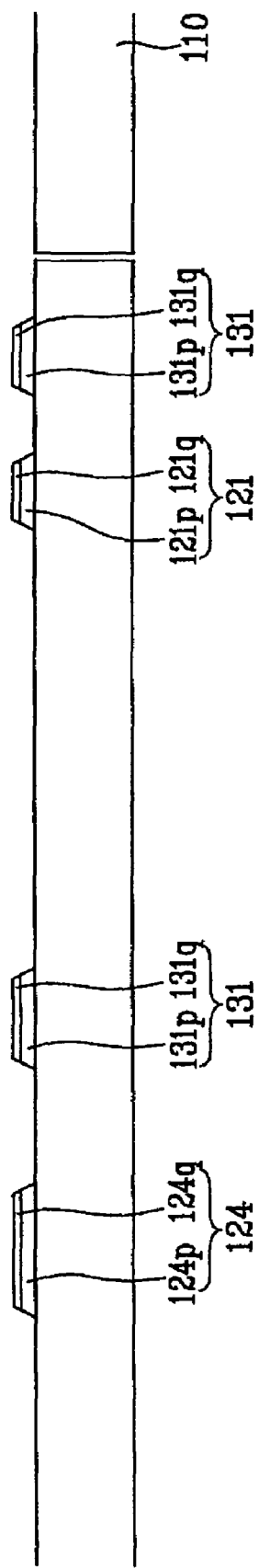

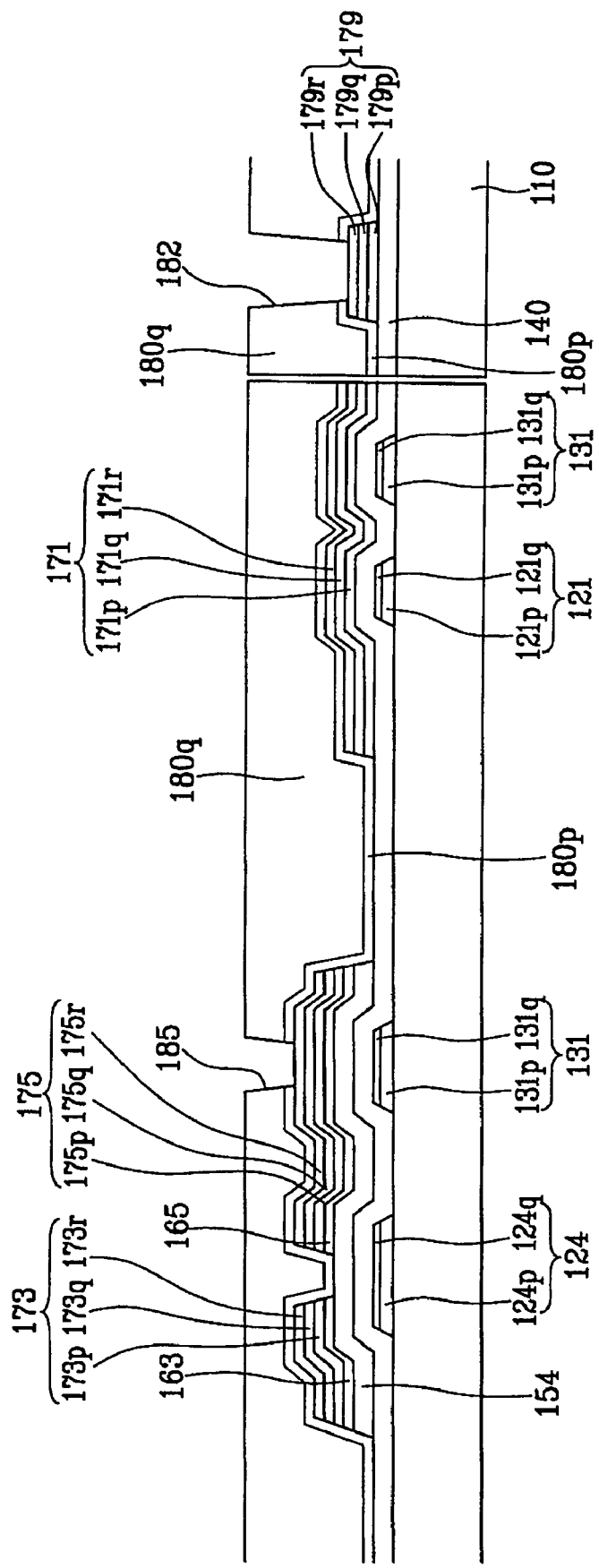

METHOD OF MANUFACTURING A FLEXIBLE THIN FILM TRANSISTOR ARRAY PANEL INCLUDING PLASTIC SUBSTRATE

CROSS-REFERENCE TO RELATED APPLICATIONS

This application claims priority to and the benefit of Korean Patent Application No. 10-2005-0000173 filed on Jan. 3, 2005 which is hereby incorporated by reference for all purposes as if fully set forth herein.

BACKGROUND OF THE INVENTION

1. Field of the Invention

The present invention relates to a method for manufacturing a thin film transistor array panel, more particularly, to a method for manufacturing a flexible thin film transistor array panel including plastic substrate.

2. Description of the Related Art

A liquid crystal display (LCD) and an organic light emitting display (OLED) are common flat panel displays.

An LCD includes two panels provided with field-generating electrodes, such as pixel electrodes and a common electrode, and polarizers, and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

An organic light emitting display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and pair annihilated with emitting light.

However, because the liquid crystal display and the organic light emitting display include fragile and heavy glass substrate, they are difficult to transport and not suitable for large scale display.

Accordingly, a display device using a flexible substrate, such as plastic, which is light and strong, is being developed.

The plastic substrate has many advantages over the glass substrate, such as portability, stability and lighter weight. Further, a deposition process and a printing process may be used to form the flexile display. Still further, the flexible display using the plastic substrate may be manufactured by a roll-to-roll process instead of a general sheet unit process. Accordingly, production cost may be minimized due to the production of a large quantity.

However, the plastic substrate, which has weak heat properties, is easily expanded in conventional manufacturing process due to high temperature, thereby resulting in misalignment between thin film patterns due to the expansion.

SUMMARY OF THE INVENTION

This invention provides a method of manufacturing a flexible display, which includes forming a gate line including a gate electrode on a substrate, sequentially depositing a gate insulating layer covering the gate line, and a semiconductor layer, firstly etching the semiconductor layer, secondly etching the semiconductor layer, forming a data line including a source electrode, and a drain electrode on the semiconductor layer and the gate insulating layer, and forming a pixel electrode connected to the drain electrode.

Additional features of the invention will be set forth in the description which follows, and in part will be apparent from the description, or may be learned by practice of the invention.

The present invention discloses a method of manufacturing a flexible display, the method including forming a gate line comprising a gate electrode on a substrate, depositing a gate insulating layer covering the gate line, depositing a semiconductive layer, e.g., semiconductor layer, covering the gate insulating layer, firstly etching the semiconductor layer, secondly etching the semiconductor layer, forming a data line including a source electrode and a drain electrode on the semiconductor layer, and forming a pixel electrode connected with the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 6B is a sectional view of the TFT array panel shown in FIG. 6A taken along the line VIb-VIb'.

FIG. 14B is a sectional view of the TFT array panel shown in FIG. 4A taken along the line IVb-IVb'.

FIG. 22B is a sectional view of the TFT array panel shown in FIG. 22A taken along the line XXIIb-XXIIb'.

DETAILED DESCRIPTION OF EMBODIMENTS

Figure 1:
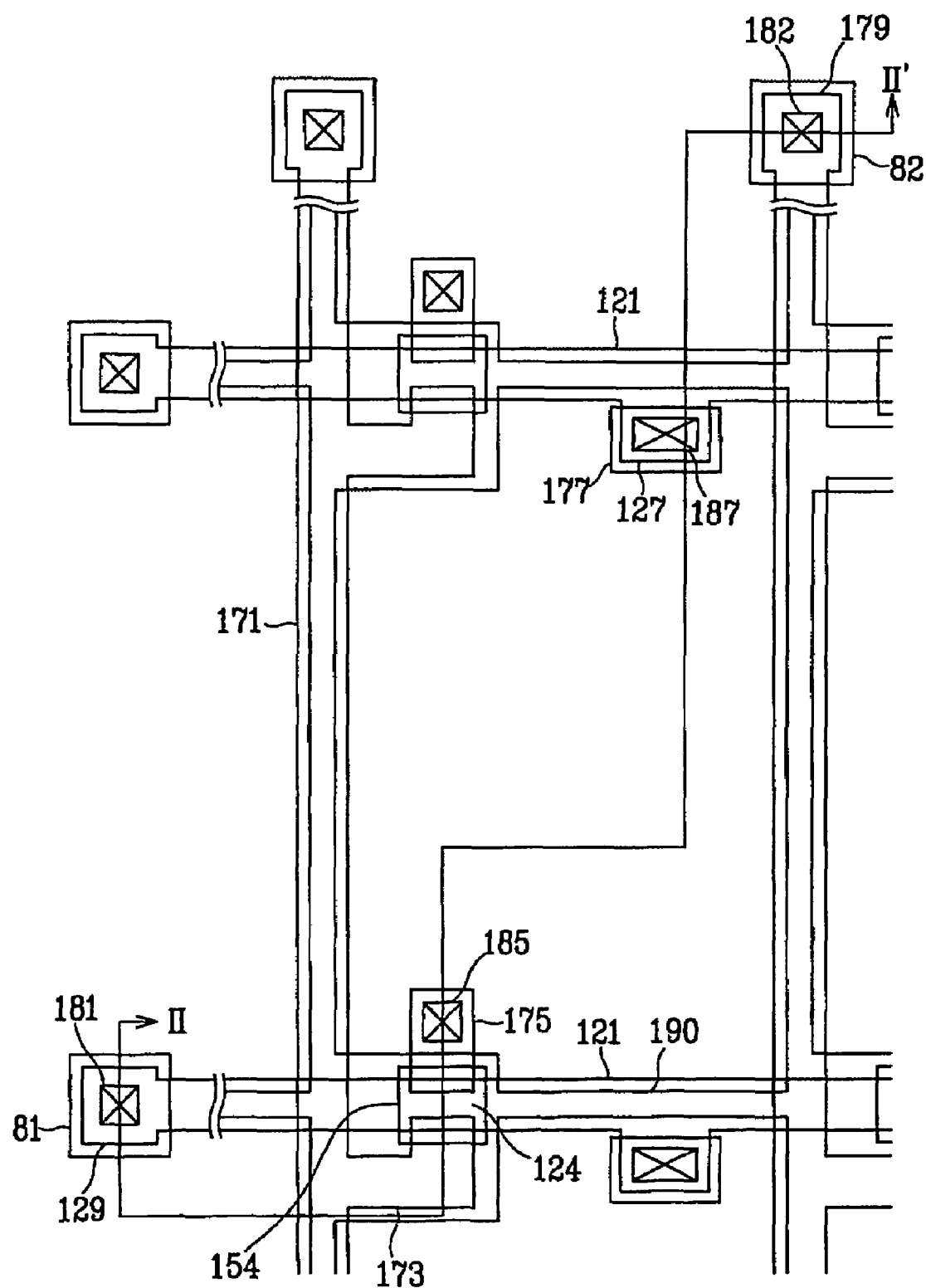
FIG. 1 is a layout view of a TFT array panel for an LCD according to an embodiment of the invention.

The present invention is described more fully below with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It is understood that when an element, such as a layer, film, region or substrate, is referred to as being "on" another element, such element may be directly on the other element or intervening elements may also be present. Alternately, when an element is referred to as being "directly on" another element, there are no intervening elements present.

A thin film transistor array panel is described with reference FIG. 1 and FIG. 2.

FIG. 1 is a layout view of a TFT array panel for an LCD. FIG. 2 is a sectional view of the TFT array panel shown in FIG. 1 taken along the lines II-II'.

An insulating substrate 110, which may be made with plastic material is provided, and an upper barrier layer 111a and a lower barrier layers 111b, which are each made of an inorganic material such as of $SiO_2$, $SiN_x$, or an organic material, are respectively formed on opposite surfaces of the plastic substrate 110, e.g., a top surface and a bottom surface, respectively.

The plastic substrate includes a layer made of at least one material selected from polyacrylate, polyethylene-terephthalate, polyethylene-naphthalate, polycarbonate, polyarylate, polyether-imide, polyehtersulfone, and polyimides. Alternatively, the plastic substrate may have a multi layered structure including the layer previously discussed.

The lower barrier layer 111a and the upper barrier layer 111b prevent oxygen, moisture, or airborne contaminants from penetrating the plastic substrate 110. According to other embodiments of the invention, the lower barrier layer 111a and/or the upper barrier layer 111b may be omitted.

A plurality of gate lines 121 are formed on the upper barrier layer 111b.

The gate lines 121 may extend substantially in a transverse direction and are separated from each other and transmit gate signals. Each gate line 121 includes a plurality of portions forming a plurality of gate electrodes 124, a plurality of projections 127 protruding downward and an end portion 129 having a large area for contact with another layer or an external driving circuit. The gate lines 121 may extend and connect with a driving circuit. The driving circuit may be integrated on the insulating substrate 110.

The gate lines 121 include two films having different physical characteristics, a lower film 121p and an upper film 121q. The lower film 121p may be made of low resistivity metal, such as Al and Al alloy, for reducing signal delay or voltage drop in the gate lines 121. On the other hand, the upper film 121q is preferably made of material, such as Cr, Mo and Mo alloy, which has good contact characteristics with other materials, such as IZO. For example, the lower film material may be Mo (or Mo alloy) and the upper film material may be Al (or Al alloy).

Figure 2:
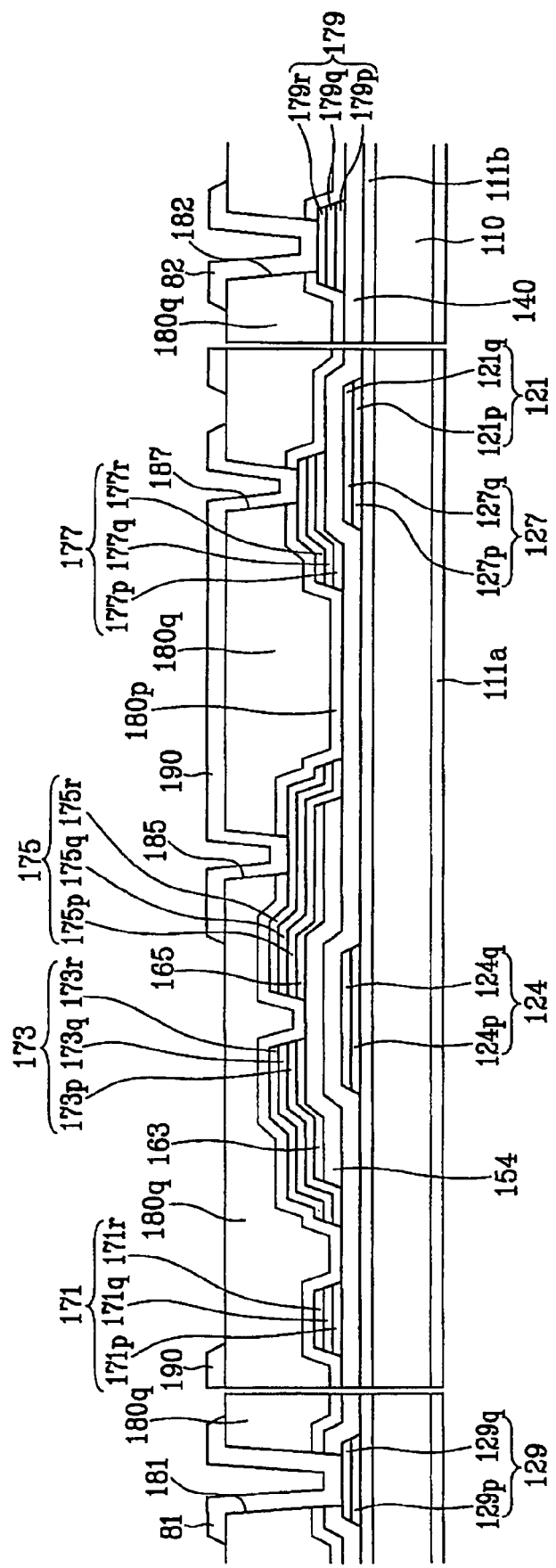
FIG. 2 is a sectional view of the TFT array panel shown in FIG. 1 taken along the lines II-II'.

In FIG. 2, the lower and the upper films of the gate electrodes 124 are indicated by reference numerals 124p and 124q, respectively. The lower and the upper films of the end positions 129 are indicated by reference numerals 129p and 129q, respectively. The lower and the upper films of the projections 127 are indicated by reference numerals 129p and 129q, respectively.

Further, the lateral sides of the upper film 121q and the lower film 121p are tapered. The inclination angle of the lateral sides with respect to a surface of the substrate 110 is between approximately 30-80 degrees.

A gate insulating layer 140 may be made of silicon nitride (SiNx) and is provided on the gate lines 121.

A plurality of semiconductor islands 154 may be made of hydrogenated amorphous silicon (abbreviated to "a-Si") or polysilicon and are provided on the gate insulating layer 140.

A plurality of ohmic contact stripes 163 and ohmic contract islands 165 may be made of silicide or n+ hydrogenated a-Si heavily doped with n-type impurity and provided on the semiconductor islands 154. Each of the ohmic contact stripe 163 is paired with an ohmic contact islands 165 on the semiconductor islands 154.

The lateral sides of the semiconductor stripes 151 and the ohmic contacts 161 and 165 are tapered or angled, and the inclination angles thereof may be between approximately 30 and 80 degrees.

A plurality of data lines 171, a plurality of drain electrodes 175 and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion area 179 having a sufficiently large area for contact with another layer or an external device.

A plurality of branches of each data line 171, which extend toward the drain electrodes 175, form a plurality of source electrodes 173. Each pair of the source electrodes 173 and the drain electrodes 175 are separated from each other and positioned opposite or adjacent to each other with respect to a gate electrode 124. The gate electrode 124, source electrode 173, drain electrode 175, and the semiconductor islands form a TFT having a channel provided in the semiconductor islands 154 between the source electrode 173 and the drain electrode 175.

The storage capacitor conductors 177 overlap the projections 127 of the gate lines 121.

The data lines 171 and the drain electrodes 175 may be made of metal such as Al, Cr, Mo, Ti, Ta or alloys thereof. The data lines 171 and the drain electrodes 175 may be a single layered or a multilayered structure. For example, in the case of a three layered structure, the data line 171, the drain electrode 175, and the storage capacitor conductor 177 have first layers 171p, 175p, and 177p, second layers 171q, 175q, and 177q, and third layers 171r, 175r, and 177r, respectively. The first layers 171p, 175p, and 177p and the third layers 171r, 175r, and 177r are respectively provided at lower and upper sides of the second layers 171q, 175q and 177q. The first layers 171p, 175p, and 177p have good electrical contact characteristics with an underlying layer and block a diffusion into the silicon layer of semiconductor. The third layers 171r, 175r, and 177r have good electrical contact characteristics with materials such as ITO or IZO. The second layers 171q, 175q, and 177q may be made of metal containing Al. The first layers 171p, 175p, and 177p and the third layers 171r, 175r, and 177r may be made of a molybdenum alloy (Mo-alloy).

Similar to the gate lines 121, the data lines 171 and the drain electrodes 175 have tapered or angled lateral sides, and the inclination angles thereof are between approximately between 30 and 80 degrees.

The ohmic contacts stripes 163 and the ohmic contact islands 165 are only provided between the underlying semiconductor islands 154 and the overlying source electrode 173 and the overlying drain electrodes 175 thereon, and reduce the contact resistance therebetween. The semiconductor islands 154 include a plurality of exposed portions, which are not covered with the data lines 171 and the drain electrodes 175, such as a portion provided between the source electrodes 173 and the drain electrodes 175.

A lower passivation layer 180p may be made of an inorganic material, such as silicon nitride or silicon oxide, and is provided or formed on the data lines 171, the drain electrodes 175, the storage electrode capacitors 177, and the exposed portions of the semiconductor islands 154. An upper passivation layer 180q is formed or provided on the lower passivation layer 180p. The upper passivation layer 180q may be made of a photosensitive organic material having a good flatness characteristic. For example, the lower passivation layer 180p may be between approximately 500-2,000 Å thick, and the upper passivation layer 180q may be between approximately 2 and 5 microns thick. The upper passivation layer made of organic material, may minimize cross-talk by counterbalancing misalignment between data lines 171, the drain electrodes 175, the storage electrode capacitors 177 and an overlying layer.

It is understood that one of the lower and the upper passivation layers 180p and 180q may be omitted.

The upper passivation layer 180p and the lower passivation layer 180q have a plurality of contact holes 182, 185 and 187 exposing the end portions 179 of the data lines 171, the drain electrodes 175, and the storage conductors 177, respectively. The upper passivation layer 180p and the lower passivation layer 180q and the gate insulating layer 140 have a plurality of contact holes 181 exposing end portions 129 of the gate lines 121.

A plurality of pixel electrodes 190 and a plurality of contact assistants 81 and 82, which may be made of IZO or ITO, are formed or provided on the upper passivation layer 180q.

The pixel electrodes 190 are physically connected with and coupled to the drain electrodes 175 through the contact holes 185 and the pixel electrodes are physically connected with and coupled to the storage capacitor conductors 177 through the contact holes 187, such that the pixel electrodes 190 receive the data voltages from the drain electrodes 175 and transmit the received data voltages to the storage capacitor conductors 177.

The pixel electrodes 190 are supplied with the data voltages to generate electric fields in cooperation with a common electrode (not shown) on another panel (not shown), which reorient liquid crystal molecules in the liquid crystal layer disposed therebetween.

The contact assistants 81 and 82 are connected with the exposed end portions 129 of the gate lines 121 and the exposed end portions 179 of the data lines 171 through the contact holes 181 and 182, respectively. It is understood that the contact assistants 81 and 82 may be omitted; however, they protect the exposed portions 129 and 179 and complement the adhesiveness of the exposed portion 129 and 179 and external devices.

A method of manufacturing the TFT array panel shown in FIG. 1 and FIG. 2 according to an embodiment of the invention is described below with reference to FIGS. 3, 4A, 4B, 5, 6A, 6B, 7A, 7B, 8A, 8B, 9A, and 9B.

Figure 3:
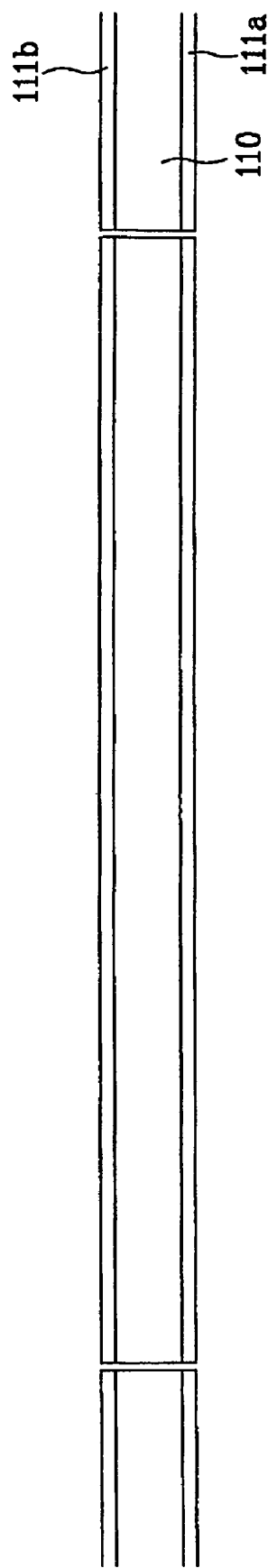
FIG. 3 is a layout view of the TFT array panel shown in FIGS. 1 and 2 of the first operation of a manufacturing method thereof according to an embodiment of the invention.
Figure 5:
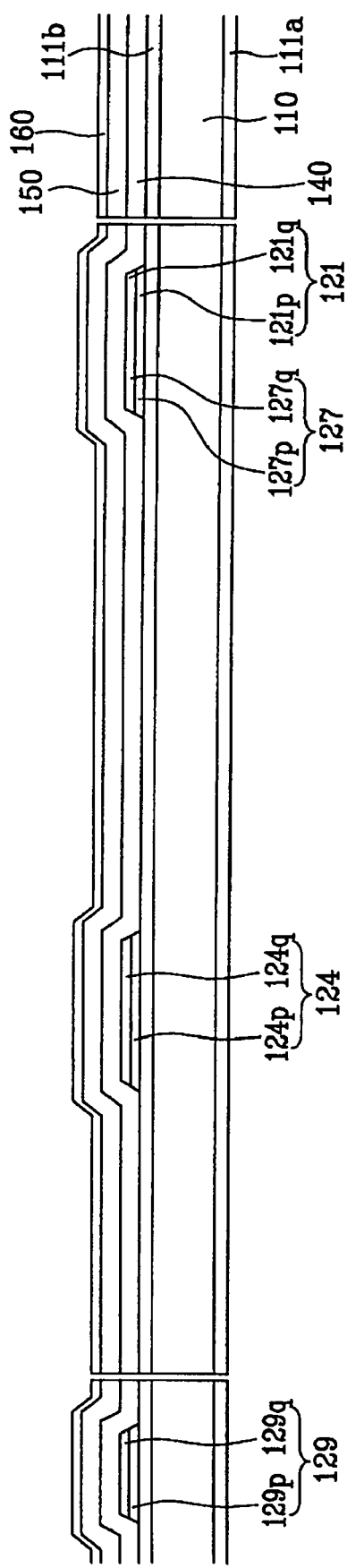
FIG. 5 is a sectional view of the TFT array panel shown in FIG. 4A taken along the line IVb-IVb', and illustrate the operation following the step shown in FIG. 4B.
Figure 6A:
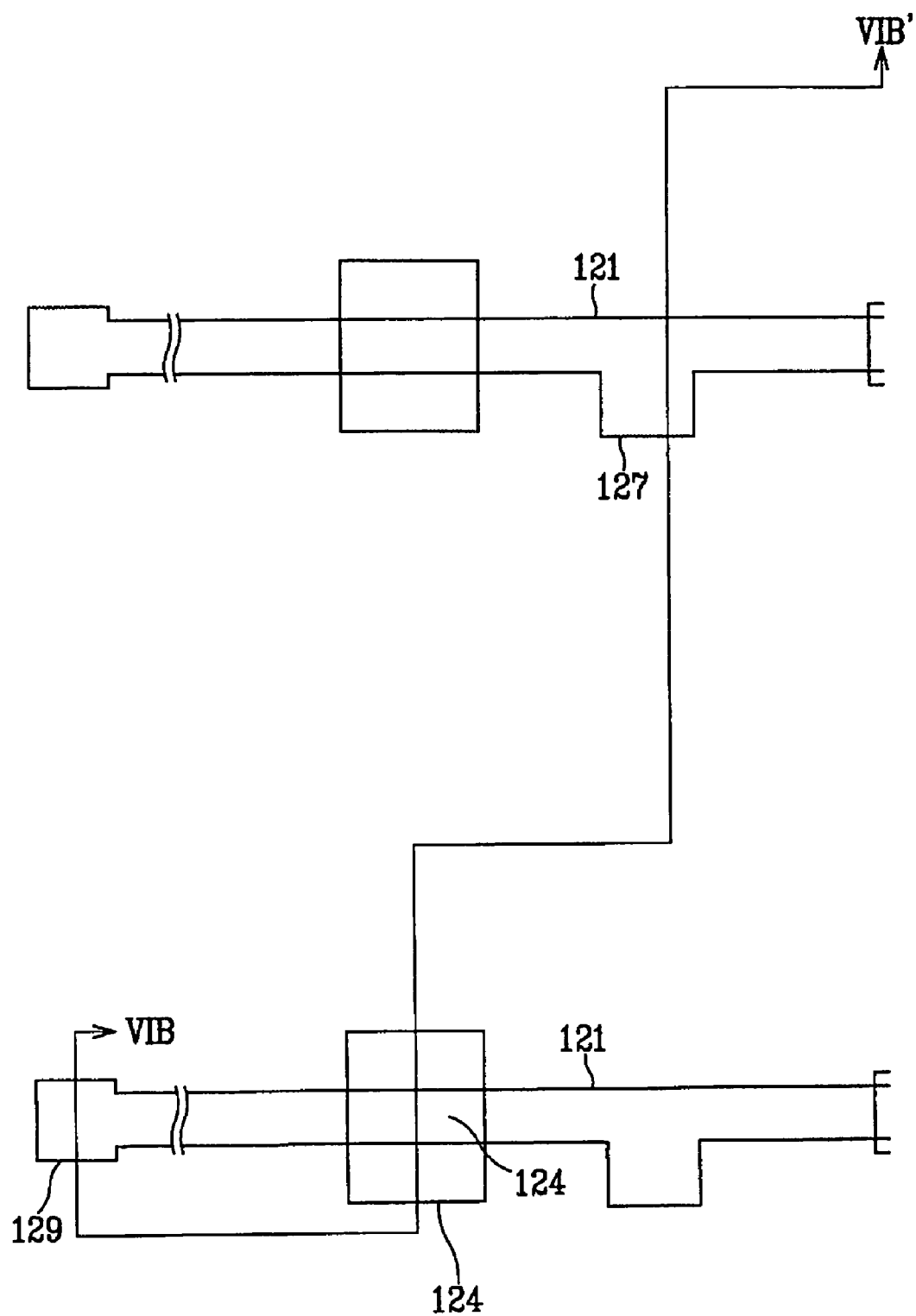

FIG. 3 is a layout view of the TFT array panel shown in FIG. 1 and FIG. 2 showing a first operation of a manufacturing method thereof according to an embodiment of the invention. FIGS. 4A, 6A, 7A, 8A and 9A are layout views of the TFT array panel shown in FIG. 1 and FIG. 2 showing intermediate operations of a manufacturing method thereof according to an embodiment of the invention. FIG. 4B is a sectional view of the TFT array panel shown in FIG. 4A taken along the line IVb-IVb'. FIG. 5 is a sectional view of the TFT array panel shown in FIG. 4A taken along the line IVb-IVb', and shows the operation following the operation shown in FIG. 4B, FIG. 6B is a sectional view of the TFT array panel shown in FIG. 6A taken along the line VIb-VIb'. FIG. 7B is a sectional view of the TFT array panel shown in FIG. 7A taken along the line VIIb-VIIb'. FIG. 8B is a sectional view of the TFT array panel shown in FIG. 8A taken along the line VIIIb-VIIIb'. FIG. 9B is a sectional view of the TFT array panel shown in FIG. 9A taken along the line IXb-IXb'.

Referring to FIG. 3, an insulating substrate 110, such as plastic substrate, is provided.

The plastic substrate 110 includes at least one layer that is made of one material selected from the group consisting of polyacrylate, polyethylene-terephthalate, polyethylene-naphthalate, polycarbonate, polyarylate, polyether-imide, polyehtersulfone, and polyimides, or has a multi layered structure including the layer discussed above.

A lower barrier layer 111a and an upper barrier layer 111b are respectively formed on opposite surfaces of the plastic substrate 110, e.g., top side and bottom side, respectively. Inorganic material, such as of $SiO_2$, $SiN_x$, is deposited by CVD on the plastic substrate to form the upper barrier layer 111b and the lower barrier layers 111a. It is understood that the lower barrier layer 111a and/or the upper barrier layer 111b may be omitted. The lower barrier layer 111a and the upper barrier layer 111b prevent oxygen, moisture, or other airborne contaminates from penetrating the plastic substrate 110.

Figure 4A:
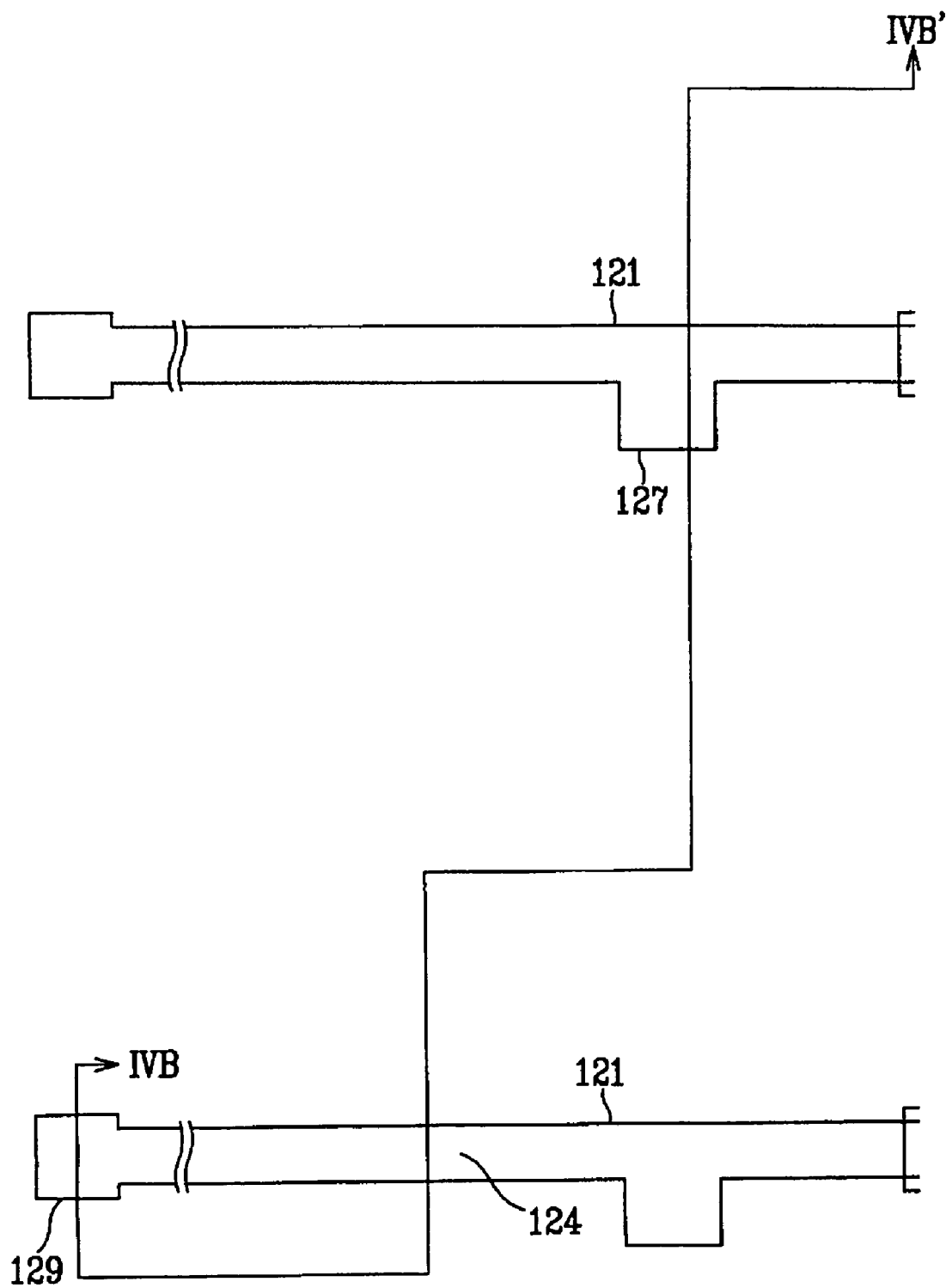
FIGS. 4A, 6A, 7A, 8A and 9A are layout views of the TFT array panel shown in FIGS. 1 and 2 during intermediate operations of a manufacturing method thereof according to an embodiment of the invention.
Figure 4B:
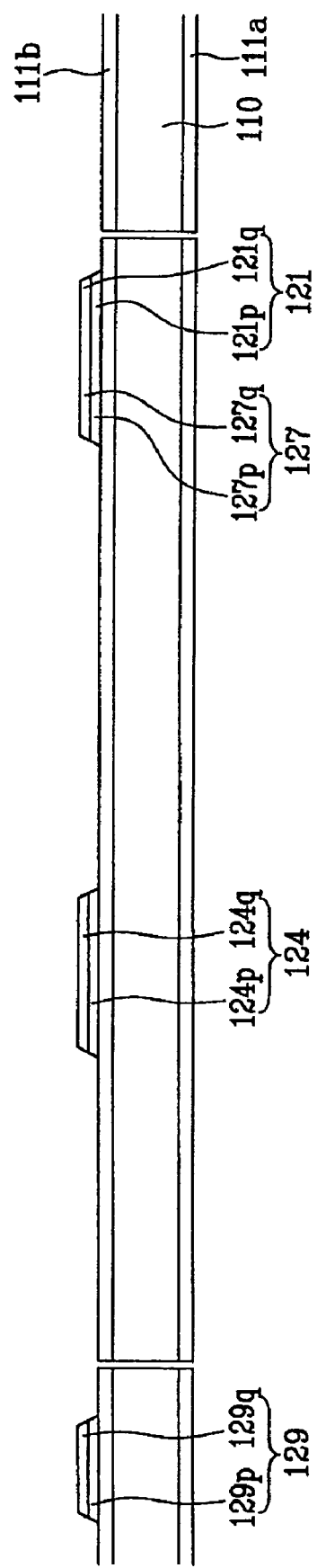
FIG. 4B is a sectional view of the TFT array panel shown in FIG. 4A taken along the line IVb-IVb'.

As shown in FIG. 4A and FIG. 4A, a metal film may be sputtered and patterned by photo-etching with a photoresist pattern on the plastic substrate 110 to form a plurality of gate lines 121 including a plurality of gate electrodes 124, a plurality of projections 127 and a plurality of end portions 129.

The gate lines 121 may have a single layer structure or a double layered structure. According to the embodiment of the invention shown in FIG. 4A and FIG. 4B, the gate lines 121 include two films having different physical characteristics, a lower film 121p and an upper film 121q. The lower film 121p may be made of Al or Al—Nd alloy having a predetermined amount of Nd, and the upper film 121q may be made of metal including Mo.

The upper and the lower layers 121p and 121q may be deposited by a Co-sputtering. The Co-sputtering may be performed as follows. Two targets are installed in a same sputtering chamber for the Co-sputtering. One target may be made of Al or Al—Nd having a predetermined amount of Nd. The other target may be made of molybdenum (Mo), or molybdenum alloy (Mo-alloy).

Power is applied to the Al (or Al—Nd) target while no power is applied to the Mo target to deposit the lower film 121p of Al (or Al alloy). The thickness of the lower layer may be approximately 2,500 Å.

Power is then switched such that it is applied to the Mo-alloy target and not applied to the Al (or Al alloy) target in order to deposit the upper film 121q.

The lower film 121p and the upper film 121q are etched with one etch condition.

Referring to FIG. 5, an inorganic material, such as of $SiO_2$ or $SiN_x$, is deposited by CVD to form a gate insulating layer 140 covering the gate lines 121.

An intrinsic a-Si layer 150 and an extrinsic a-Si layer 160 are deposited on the gate insulating layer 140.

The gate insulating layer 140 is the intrinsic a-Si layer 150, and the extrinsic a-Si layer 160 may be deposited to be between approximately 2,000 Å and 5,000 Å thick, between approximately 1,000 Å and 3,500 Å thick, and between approximately 200 Å and 1,000 Å thick, respectively. Each of the gate insulating layer 140, the intrinsic a-Si layer 150, and the extrinsic a-Si layer 160 is deposited at a temperature of between approximately 130-180 degrees Celsius, and preferably, approximately 150 degrees Celsius.

The plastic substrate 110 expands due to heat applied thereto. The expansion depends on a type of plastic material used to form the plastic substrate 110. The plastic substrate 110 may also expand during the deposition of the gate insulating layer 140, the intrinsic a-Si layer 150, and the extrinsic a-Si layer 160, because the plastic material has coefficient of thermal expansion of between approximately 50 ppm/K and 60 ppm/K.

Due to such expansion, the gate line 121 including the gate electrodes 124 and the storage electrode lines 131 deviates from the initial position.

When the extrinsic a-Si layer 150 and the intrinsic a-Si layer 160 are etched near the base position of the gate electrode 124, the misalignment between the extrinsic a-Si layer 150 and the intrinsic a-Si layer 160 and the gate electrode 124 increases. A channel may be formed in the thin film transistor at a predetermined position.

The extrinsic a-Si layer 150 and the intrinsic a-Si layer 160 may be etched more than one time, for example, two times, to minimize the misalignment, which is discussed below.

Referring to FIG. 6A and FIG. 6B, the extrinsic a-Si layer 150 and the intrinsic a-Si layer 160 are photo-etched to form a plurality of first extrinsic semiconductors island 162 and a plurality of first intrinsic semiconductor islands 152, respectively, with a predetermined shape and size. The first extrinsic semiconductor islands 162 and the first intrinsic semiconductor islands 152 are sufficiently large enough to cover the initial size of the gate electrode 124 (before depositing the extrinsic a-Si layer 150 and the intrinsic a-Si layer 160), and the expanded size of the gate electrode 124 after depositing the extrinsic a-Si layer 150 and the intrinsic a-Si layer 160.

After forming the first extrinsic semiconductor islands 162 and the first intrinsic semiconductor islands 152, the stress applied to the plastic substrate 110 due to the extrinsic a-Si layer 150 and the intrinsic a-Si layer 160 deceases, and the plastic substrate 110 is restored to its initial state.

The positions of the gate electrodes 124 are restored according to the restoration a s of the plastic substrate 110.

Figure 7A:
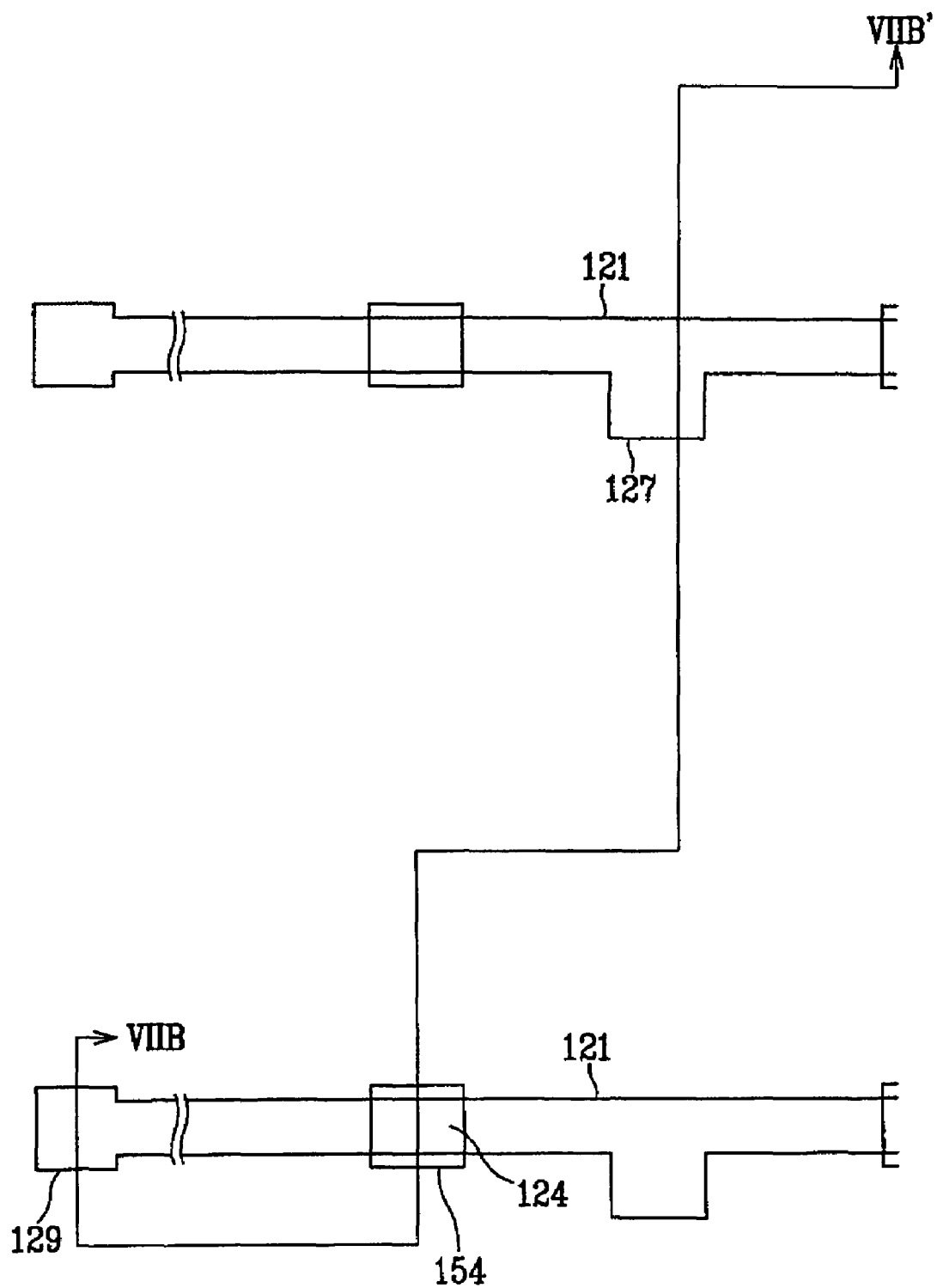
Figure 7B:
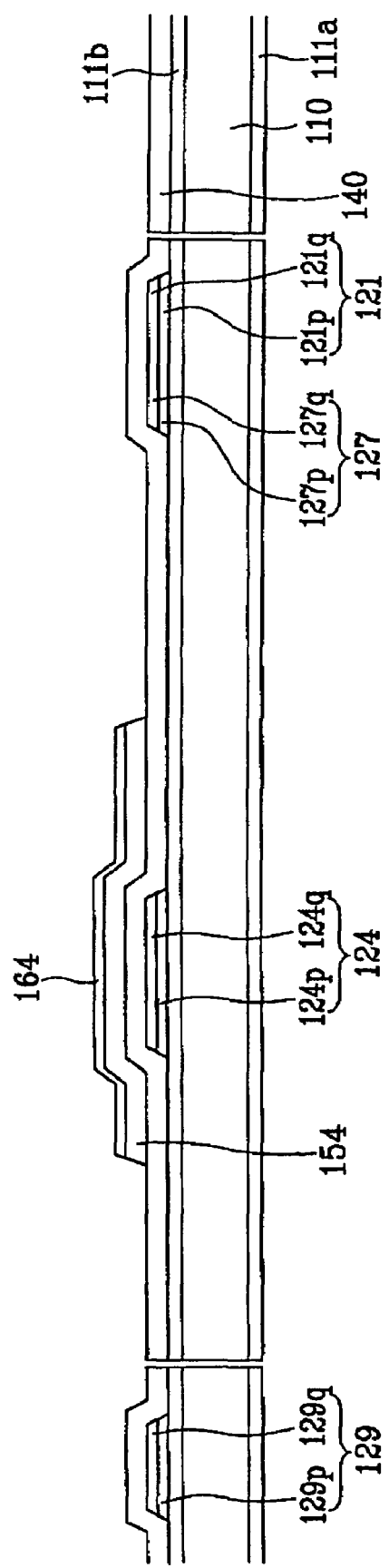
FIG. 7B is a sectional view of the TFT array panel shown in FIG. 7A taken along the line VIIb-VIIb'.

Referring to FIGS. 7A and 7B, the first extrinsic semiconductor islands 162 and the first intrinsic semiconductor islands 152 are photo-etched again with reference to the restored positions of the gate electrodes 124 to form a plurality of second semiconductor islands 154 and a plurality of second extrinsic semiconductor islands 164. The second semiconductor islands 154 are accurately aligned at the position where the channels of thin film transistors are formed.

As above described, the first extrinsic semiconductor islands 162 and the first intrinsic semiconductor islands 152 are formed with enough size in consideration of the expansion. The second semiconductor islands 154 and the second extrinsic semiconductor islands 164 are then photo-etched at an accurate position after the plastic substrate 110 is restored to its initial state at a normal temperature. Thus, the misalignment between the gate electrodes 124 and the second semiconductor islands 154 may be minimized.

Figure 8A:
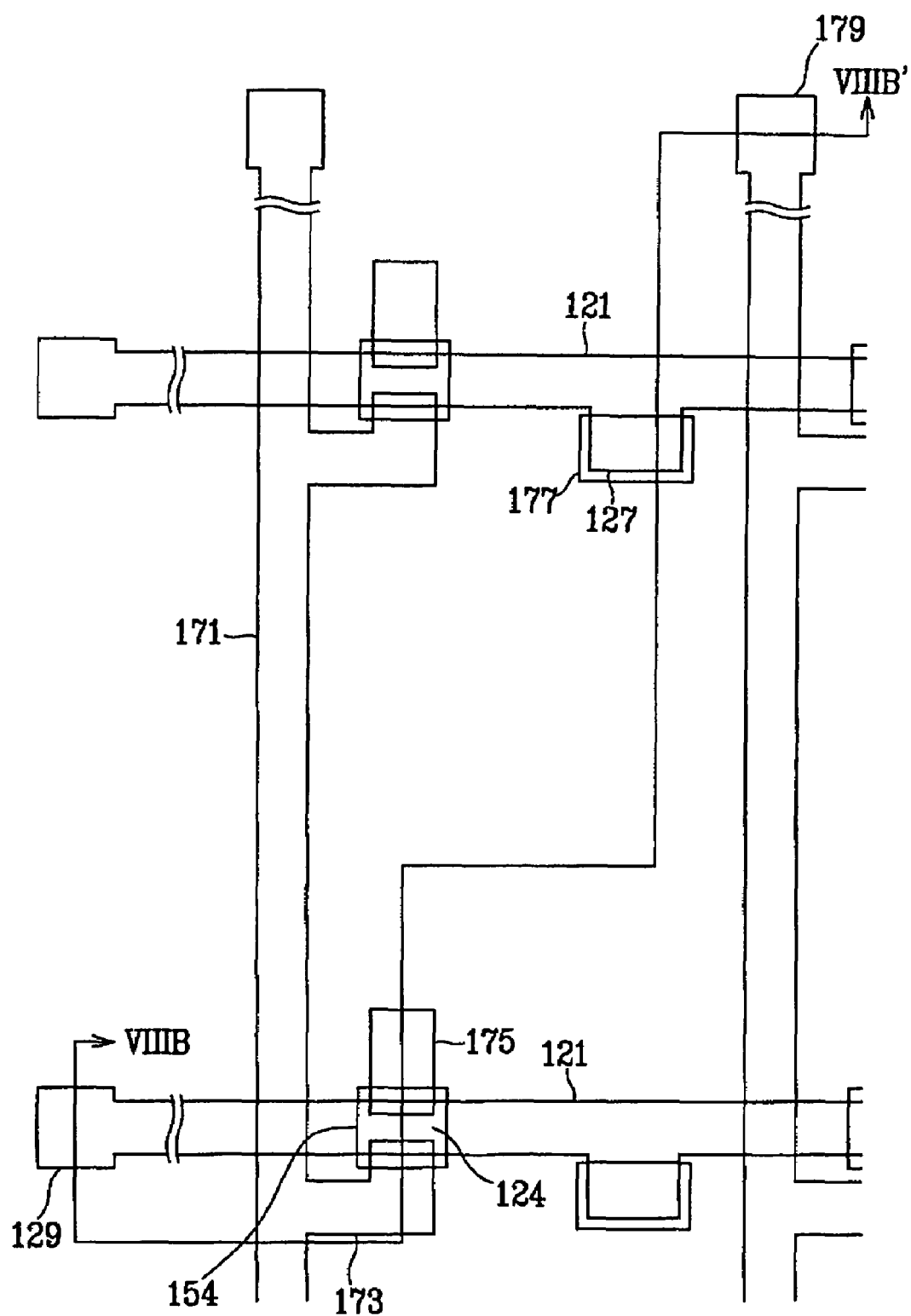
Figure 8B:
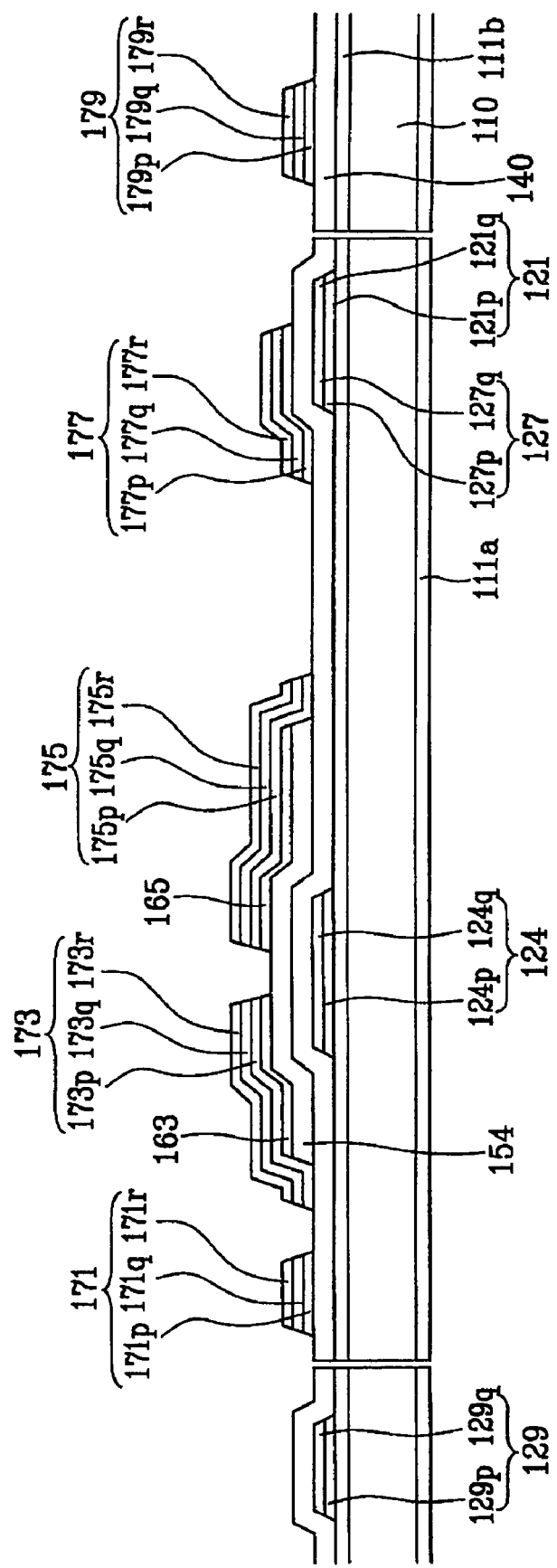
FIG. 8B is a sectional view of the TFT array panel shown in FIG. 8A taken along the line VIIIb-VIIIb'.

Referring to FIGS. 8A and 8B, a metal film may be sputtered and etched using a photoresist to form a plurality of data lines 171 including a plurality of source electrodes 173, a plurality of drain electrodes 175, and a plurality of storage capacitor conductors 177. First layers 171p, 175p, and 177p having Mo, second layers 171q, 175q, and 177q having Al, and third layers 171r, 175r, and 177r having Mo are sequentially deposited such that each layer is approximately 3,000 Å thick and photo-etched in the etch condition using one etchant.

Before or after removing the photoresist, portions of the second extrinsic semiconductor stripes 164, which are not covered with the data lines 171, the drain electrodes 175, and the storage capacitor conductors 177, are removed by an etching process to form a plurality of ohmic contact islands 163 and 165 and expose portions of the intrinsic semiconductor island 154. Oxygen plasma treatment may be performed thereafter to stabilize the exposed surfaces of the semiconductor stripes 151.

Figure 9A:
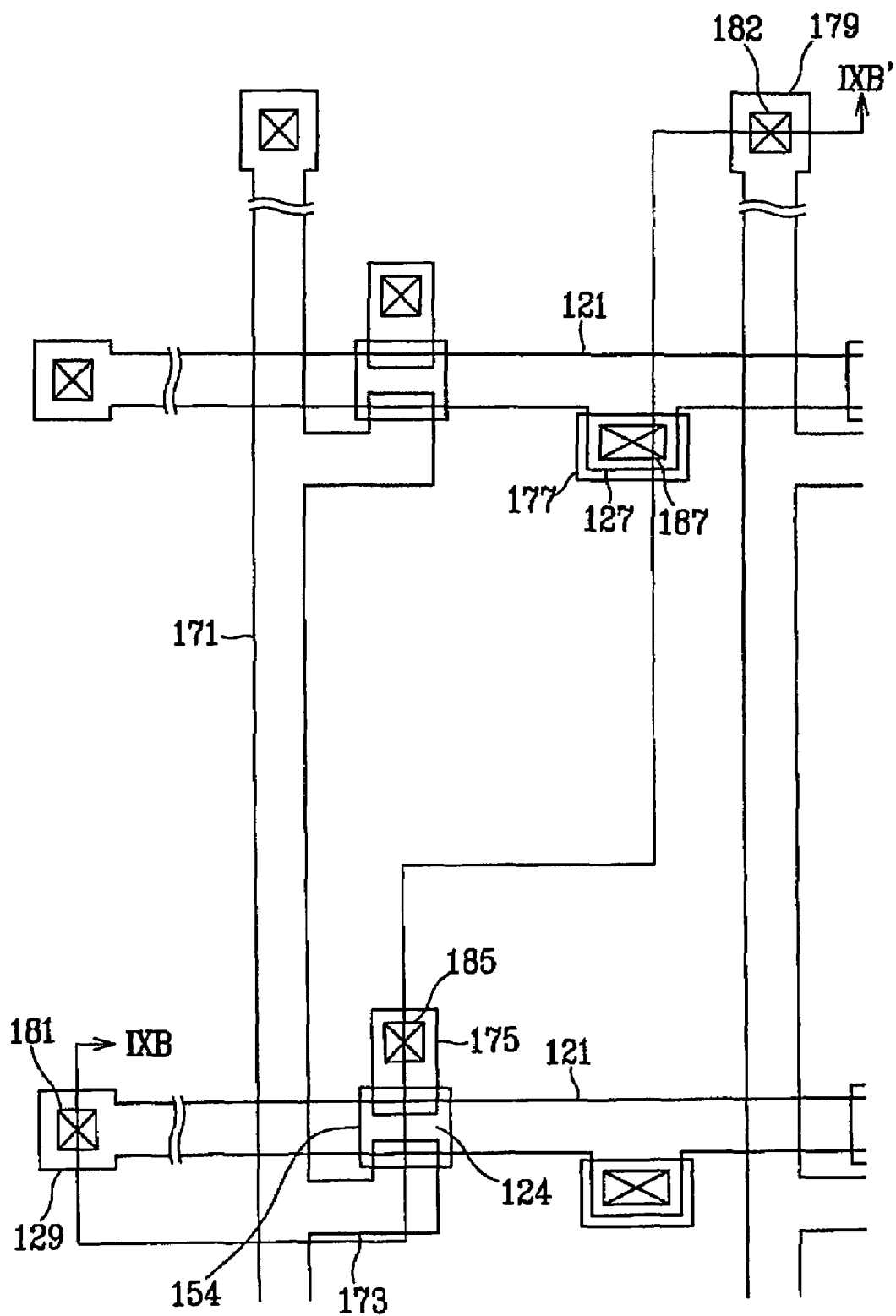
Figure 9B:
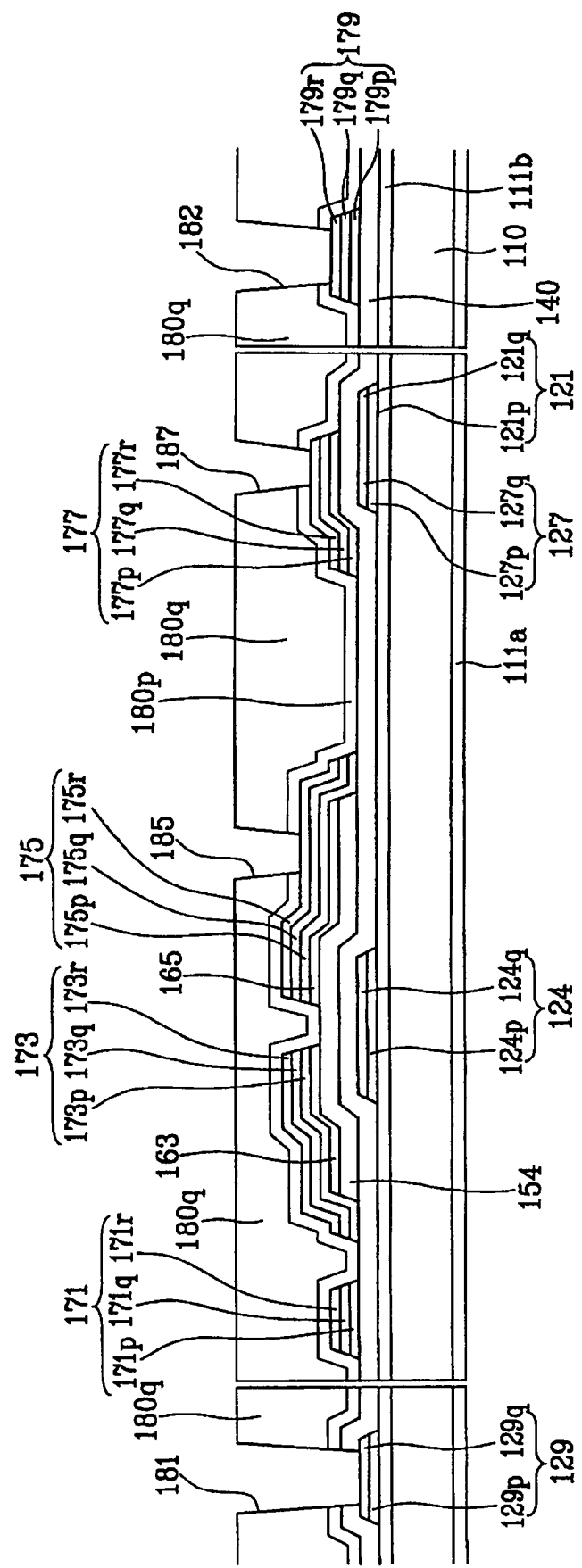
FIG. 9B is a sectional view of the TFT array panel shown in FIG. 9A taken along the line IXb-IXb'.

Referring to FIGS. 9A and 9B, a lower passivation layer 180p, which may be made of an inorganic material, such as silicon nitride or silicon oxide, is formed by plasma enhanced chemical vapor deposition (PECVD). An upper passivation layer 180q which may be made of a photosensitive organic material, such as polyimide, is applied on the lower passivation layer 180p. The lower passivation layer 180p may be formed having a thickness of between approximately 500 and 2,000 Å. The upper passivation layer 180q may be formed having a thickness of between approximately 2 and 5 microns.

The upper passivation layer 180q is then exposed to light through a photo mask and developed to expose a portion of the lower passivation layer 180p. The exposed portion of the lower passivation layer 180p is then dry etched along with the gate insulating layer 140 to form a plurality of contact holes 181, 182, 185 and 187.

Referring to FIG. 1 and FIG. 2B, a conductive layer, which may be made of a transparent material, such as ITO, IZO and a-ITO (amorphous indium tin oxide), is deposited by sputtering and is etched using the photoresist to form a plurality of pixel electrodes 190 and a plurality of contact assistants 81 and 82.

The upper passivation layer made of organic material may minimize cross-talk by counterbalancing misalignment between data lines 171, the drain electrodes 175, the storage electrode capacitors 177 and the pixel electrode 190.

Figure 10A:
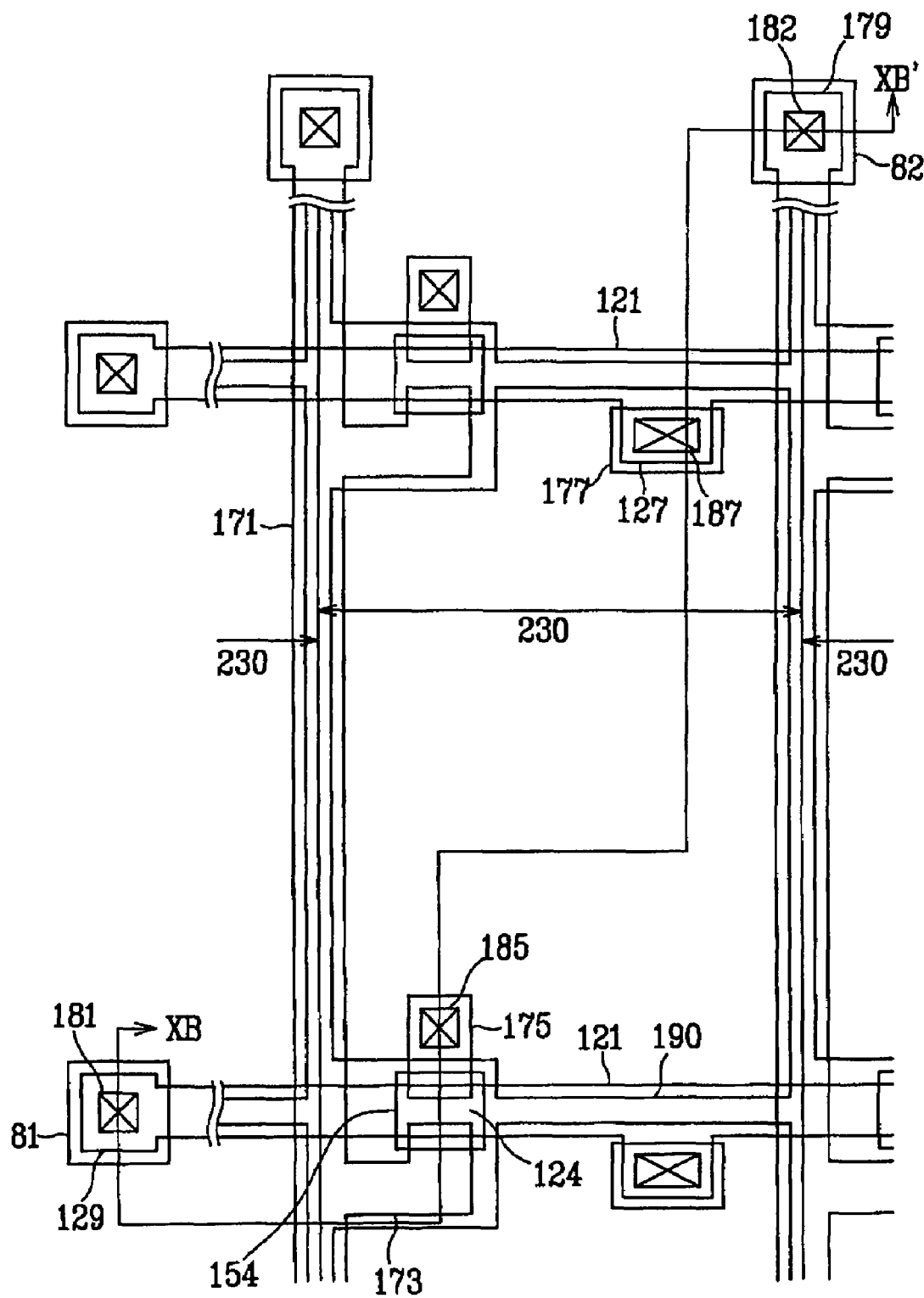
FIG. 10A is a layout view of a TFT array panel for an LCD according to another embodiment of the invention.
Figure 10B:
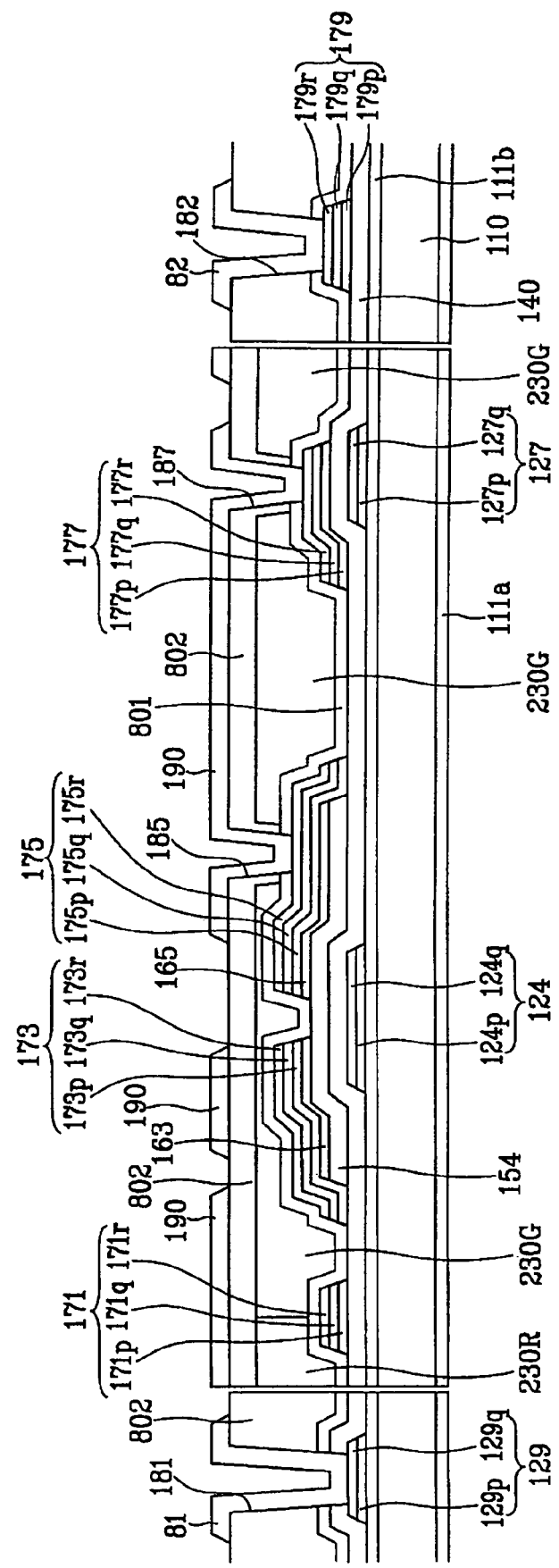
FIG. 10B is a sectional view of the TFT array panel shown in FIG. 10A taken along the lines Xb-Xb'.

FIG. 10A is a layout view of a TFT array panel for an LCD according to another embodiment of the invention. FIG. 10B is a sectional view of the TFT array panel shown in FIG. 1 taken along the lines Xb-Xb'.

Referring to FIGS. 10A and 10B, layered structures of the TFT panels are substantially similar to the layer structures of the TFT panels shown in FIG. 1 and FIG. 2.

A plurality of gate lines 121 including a plurality of gate electrodes 124, a plurality of projections 127 and a plurality of end portions 129 are formed on a plastic substrate 110, and a gate insulating layer 140, a plurality of semiconductor islands 154, and a plurality of ohmic contact islands 163 and 165 are sequentially formed thereon. A plurality of data lines 171 including source electrodes 173 and end portions 179, a plurality of drain electrodes 175 and a plurality of storage capacitor conductors 177 are formed on the ohmic contact strikes 163 and ohmic contact islands 165, and the gate insulating layer 140, and a lower and upper passivation layers 180p and 180q are formed thereon. A plurality of contact holes 181, 182, 185 and 187 are provided at predetermined position of the lower and the upper passivation layers 180p and 180q, and/or the gate insulating layer 140. A plurality of pixel electrodes 190 and a plurality of contact assistants 81 and 82 are formed on the upper passivation layer 180b.

The TFT array panel includes a plurality of color filters 230 formed on the lower passivation layer 180p and an upper passivation layer 180q is formed thereon. The color filters 230 extend substantially along the longitudinal direction along the data lines 171 and are located between the data lines 171. The color filters 230 may represent, for example, one of the primary colors, such as red, green and blue. The low passivation layer 180p prevents the resin of the color filters 230 from polluting or adversely affecting the semiconductor islands 154.

The color filters 230 are removed on the peripheral area in which the end portions 129 and 179 of the gate and data lines are provided, and the edge portions of color filters 230 overlap the data lines 171 to block light leakage between the pixels. The edge portions of the color filters 230 overlapping the data lines 171 may overlap each other and be thinner than the center portions disposed between the data lines 171 in order to improve the step coverage characteristics of an overlying layer and the flatness of the surface of the panel, thereby distorting the alignment of liquid crystal molecules.

The upper passivation layer 180q prevents the resin of the color filters 230 from polluting or adversely affecting the pixel electrode 190.

The color filters 230 have a plurality of openings 235 and 237 exposing the drain electrode 175, the storage capacitor conductors 177, the lower passivation layer 190a, and the upper passivation layer 190b.

A method of manufacturing the TFT array panel shown in FIG. 10A and FIG. 10B according to another embodiment of the present invention is described below with reference to FIG. 3 through FIG. 8, and FIG. 11A through FIG. 12B.

Figure 11A:
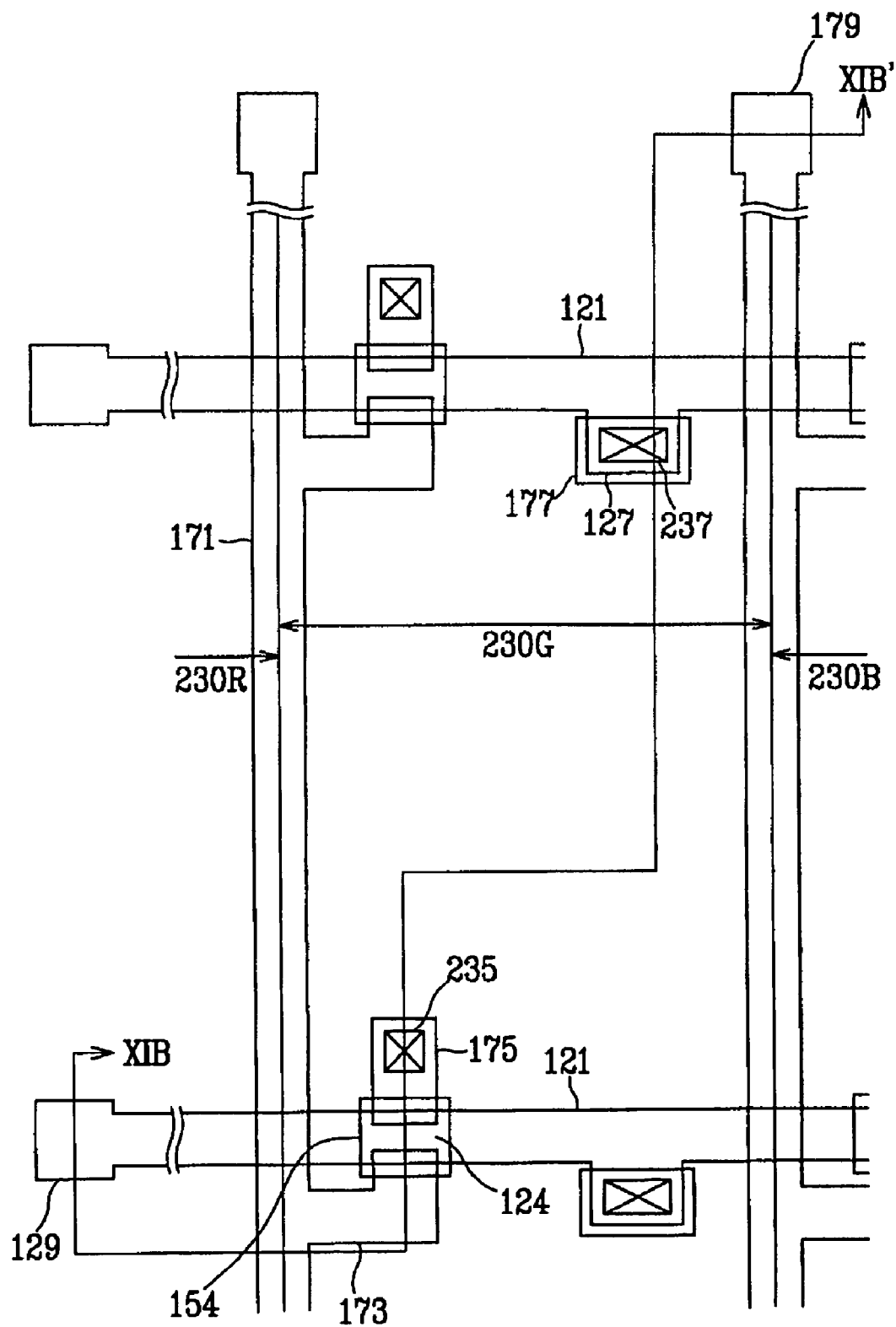
FIGS. 11A and 12A are layout views of the TFT array panel shown in FIGS. 10A and 10B in intermediate steps of a manufacturing method thereof according to another embodiment of the invention.
Figure 11B:
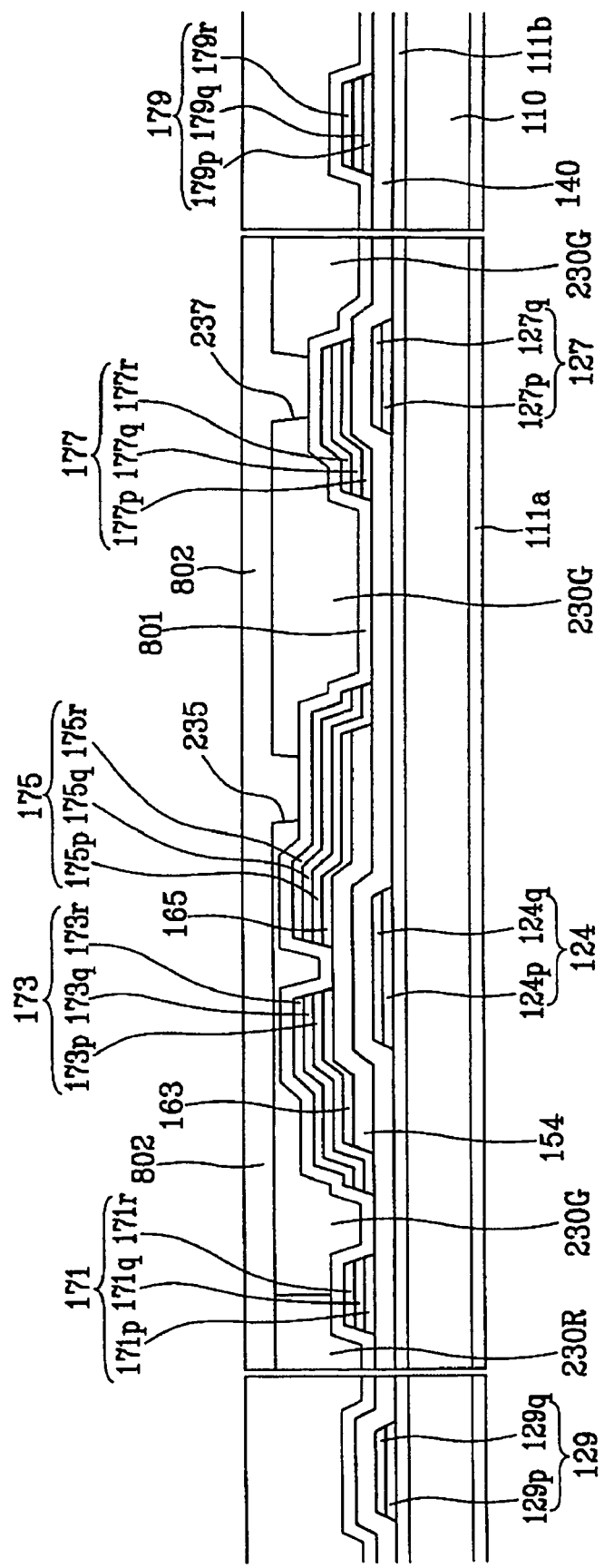
FIG. 11B is a sectional view of the TFT array panel shown in FIG. 11A taken along the line XIb-XIb'.
Figure 12A:
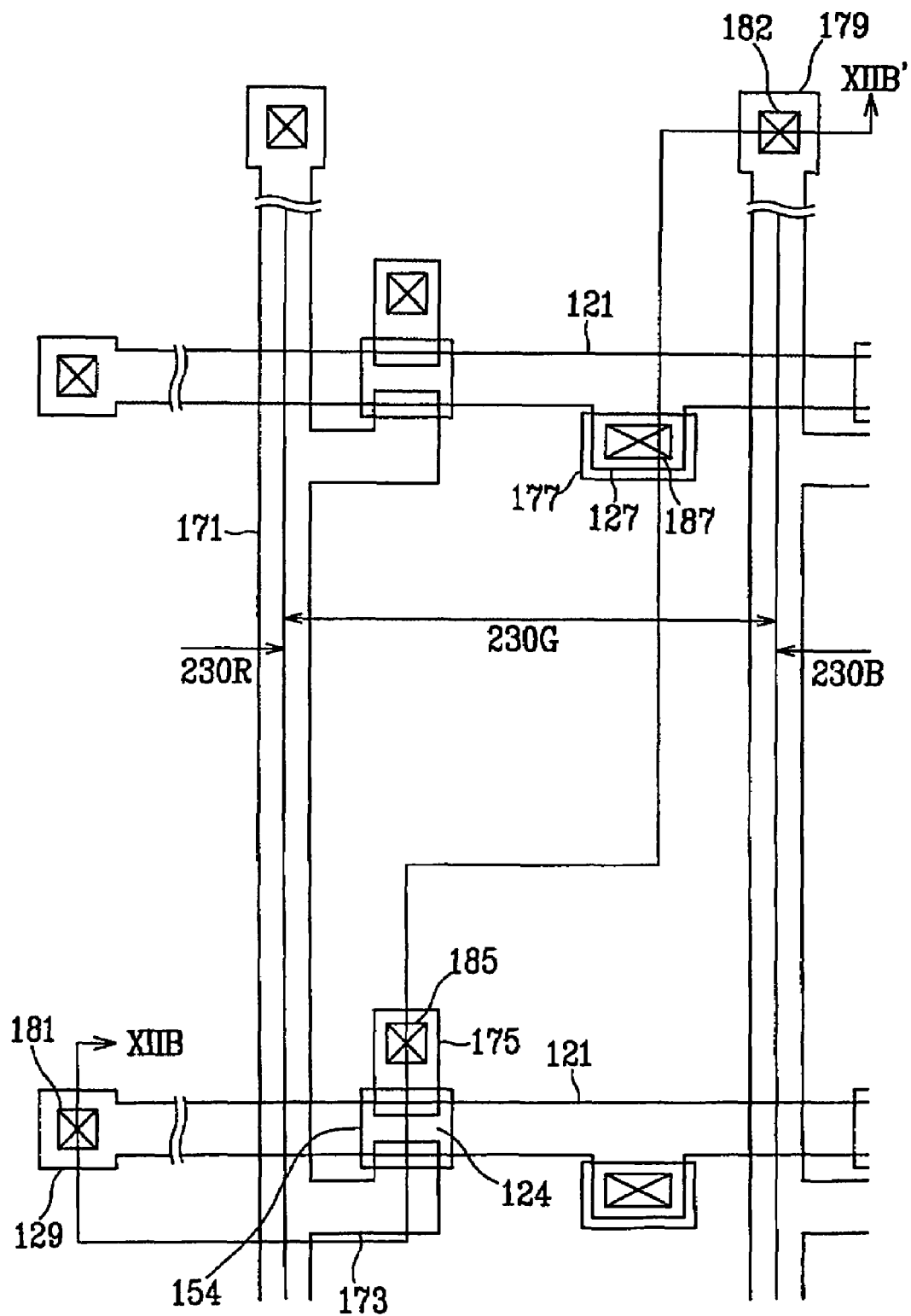
Figure 12B:
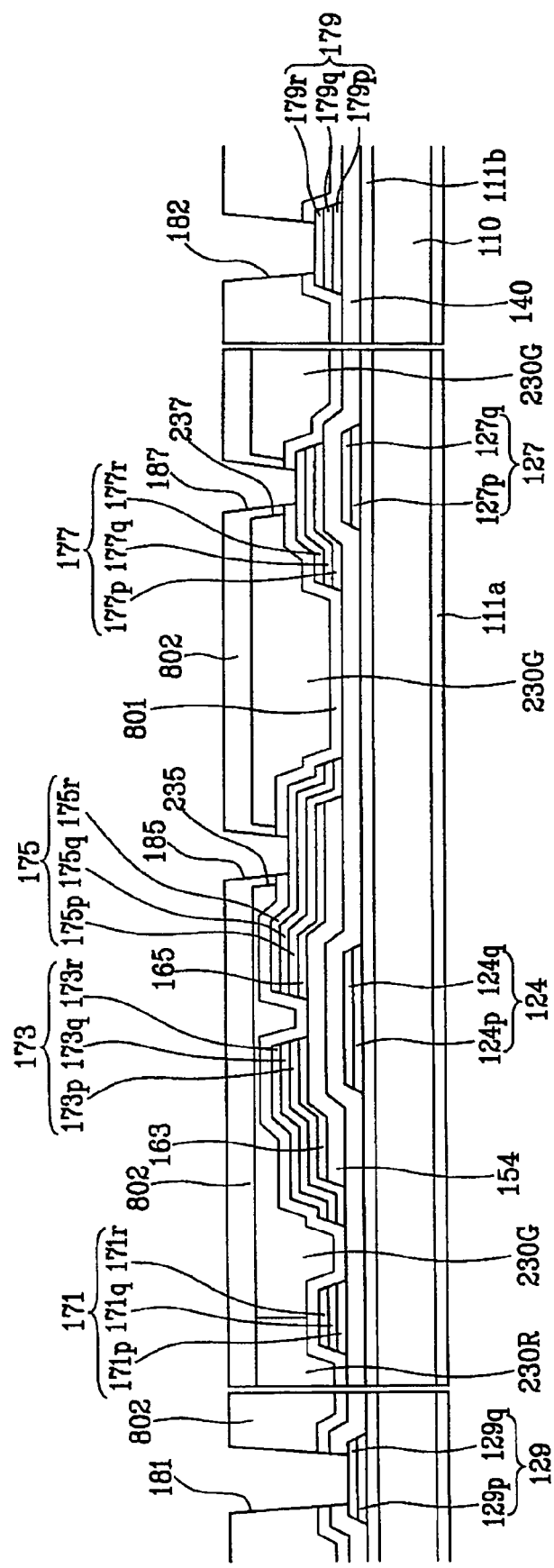
FIG. 12B is a sectional view of the TFT array panel shown in FIG. 12A taken along the line XIIb-XIIb'.

FIGS. 11A and 12A are layout views of the TFT array panel shown in FIG. 10A and FIG. 10B during intermediate steps of a manufacturing method thereof. FIG. 11B is a sectional view of the TFT array panel shown in FIG. 11A taken along the line XIb-XIb'. FIG. 12B is a sectional view of the TFT array panel shown in FIG. 12A taken along the line XIIb-XIIb'.

As shown in FIG. 3 through FIG. 8B, a plurality of gate lines 121 including a plurality of gate electrodes 124, a plurality of projections 127, and a plurality of end portions 129 are formed on a plastic substrate 110. A gate insulating layer 140 is formed to cover the gate lines 121. A plurality of semiconductor islands 154 and a plurality of ohmic contact stripes 163 and ohmic contact islands 165 are sequentially formed thereon, similar to the previous embodiment discussed above, and a plurality of data lines 171 including source electrodes 173 and end portions 179, a plurality of drain electrodes 175, and a plurality of storage capacitor conductors 177 are formed thereon.

A lower passivation layer 180p, which may be made of an inorganic material, such as silicon nitride or silicon oxide, is formed by plasma enhanced chemical vapor deposition (PECVD).

Referring to FIG. 11A and FIG. 11B, a plurality of color filters 230 are formed on the lower passivation layer 180p. The color filters 230 may be formed, for example, by sequentially coating, light-exposing, and developing negative photosensitive organic material having red, green, and blue pigments. A plurality of openings 235 and 237 exposing portions of the lower passivation 180p on the drain electrodes 175 and the storage capacitor conductors 177 are formed in the color filters 230.

An upper passivation layer 180q, which may be made of a photosensitive organic material, such as polyimide, is coated on or applied to the lower passivation layer 180p.

The upper passivation layer 180p and the lower passivation layer 180q are dry etched along with the gate insulating layer 140 to form a plurality of contact holes 181, 182, 185 and 187.

Referring to FIG. 10A and FIG. 10B, a conductive layer is deposited by sputtering and is etched using the photoresist to form a plurality of pixel electrodes 190 and a plurality of contact assistants 81 and 82.

Figure 13A:
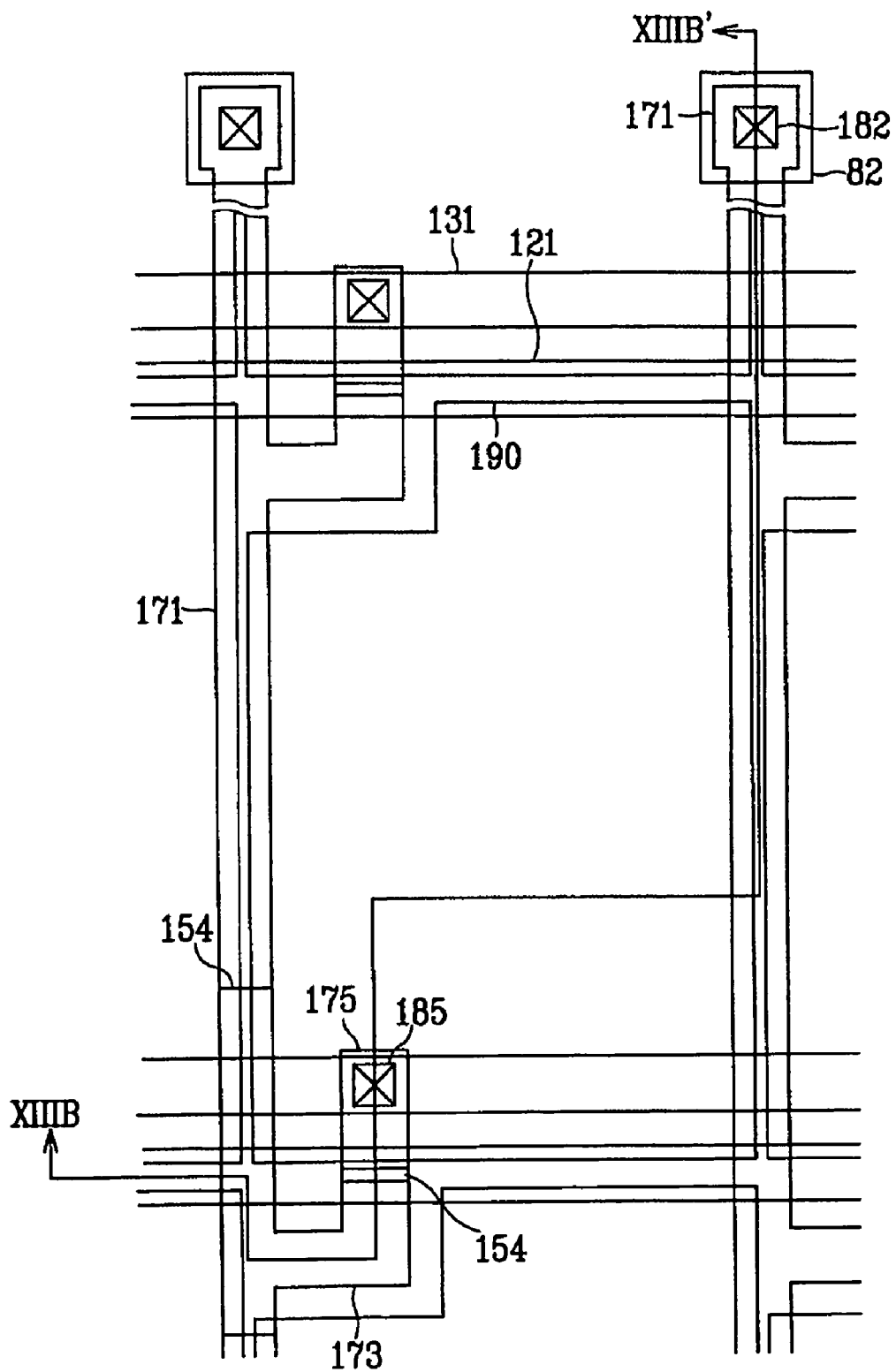
FIG. 13A is a layout view of a TFT array panel for an LCD according to another embodiment of the invention.
Figure 13B:
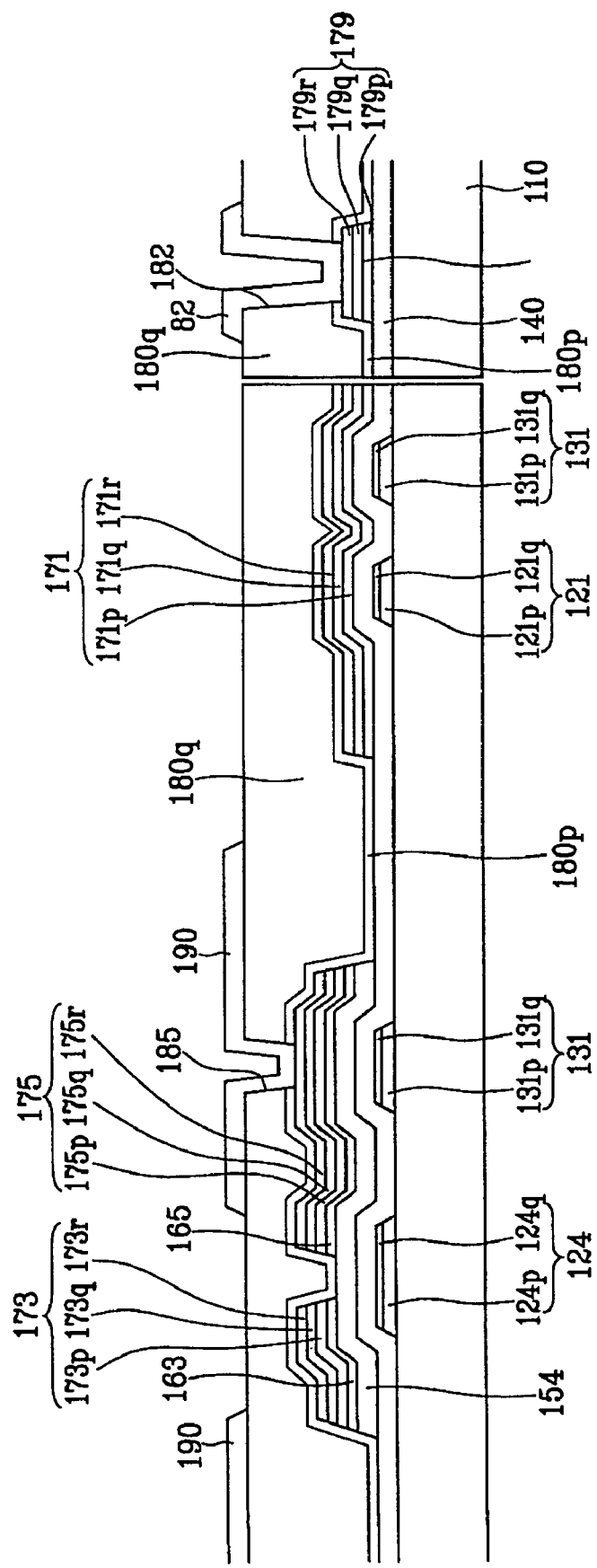
FIG. 13B is a sectional view of the TFT array panel shown in FIG. 10A taken along the lines Xb-Xb'.

FIG. 13A is a layout view of the TFT array panel for an LCD according to another embodiment of the invention. FIG. 13B is a sectional view of the TFT array panel shown in FIG. 10a taken along the lines Xb-Xb'.

Referring again to FIG. 10A and FIG. 10B, layered structures of the TFT panels according to the embodiment are substantially similar to the layered structures of the TFT panels shown in FIG. 1 and FIG. 2.

A plurality of gate lines 121 including a plurality of gate electrodes 124, a plurality of projections 127, and a plurality of end portions 129, are formed on a plastic substrate 110. A gate insulating layer 140, a plurality of semiconductor islands 154, and a plurality of ohmic contact islands 163 and 165 are sequentially formed on the plastic substrate 110. A plurality of data lines 171 including source electrodes 173 and end portions 179, a plurality of drain electrodes 175, and a plurality of storage capacitor conductors 177 are formed on the ohmic contact stripes 163 and ohmic contact islands 165, and the gate insulating layer 140, a lower passivation layer 180p and an upper passivation layer 180q are formed thereon. A plurality of contact holes 181, 182, 185 and 187 are provided at the lower passivation layer 180p, and the upper passivation layer 180q, and/or the gate insulating layer 140. A plurality of pixel electrodes 190 and a plurality of contact assistants 81 and 82 are formed on the upper passivation layer 180b.

The TFT array panel includes a plurality of storage electrode lines 131, which are separated from the gate lines 121, provided on the same layer as the gate lines 121. The TFT array panel does not include projections at the gate lines 121.

The storage electrode lines 131 are supplied with a predetermined voltage, such as the common voltage. When the TFT array panel does not include the storage capacitor conductors 177 shown in FIG. 1 and FIG. 2, the drain electrodes 175 extend and overlap the storage electrode lines 131 to form storage capacitors. The storage electrode lines 131 may be omitted when the storage capacitance generated by the overlapping of the gate lines 121 and the pixel electrodes 191 is sufficient. In order to increase operation ratio, the storage electrode lines 131 may be provided near the gate lines 121.

The semiconductor islands 154 have substantially similar shapes as the portions of the data lines 171, the drain electrodes 175, and the underlying ohmic contact stripes 163 and ohmic contact islands 165. However, the semiconductor islands 154 include some exposed portions, which are not covered with the data lines 171 and the drain electrodes 175, such as a portion located between the source electrodes 173 and the drain electrodes 175.

A method of manufacturing the TFT array panel shown in FIG. 13A and FIG. 13B according to another embodiment of the invention is described below with reference to FIGS. 14A, 14B, 15, 16A, 16B, 17, 18, 19, 20, 21A, 21B, 22A, and 22B.

Figure 17:
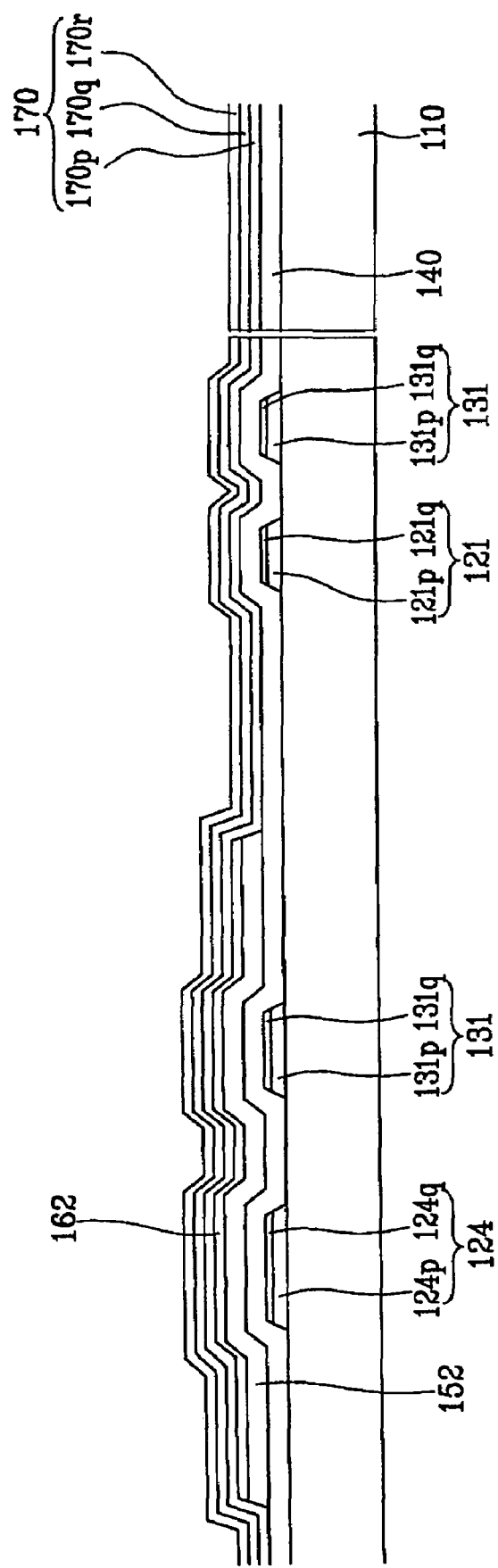
FIG. 17 is a sectional view of the TFT array panel shown in FIG. 16A taken along the line XVIb-XVIb', and shows an operation following the operation shown in FIG. 16B.
Figure 18:
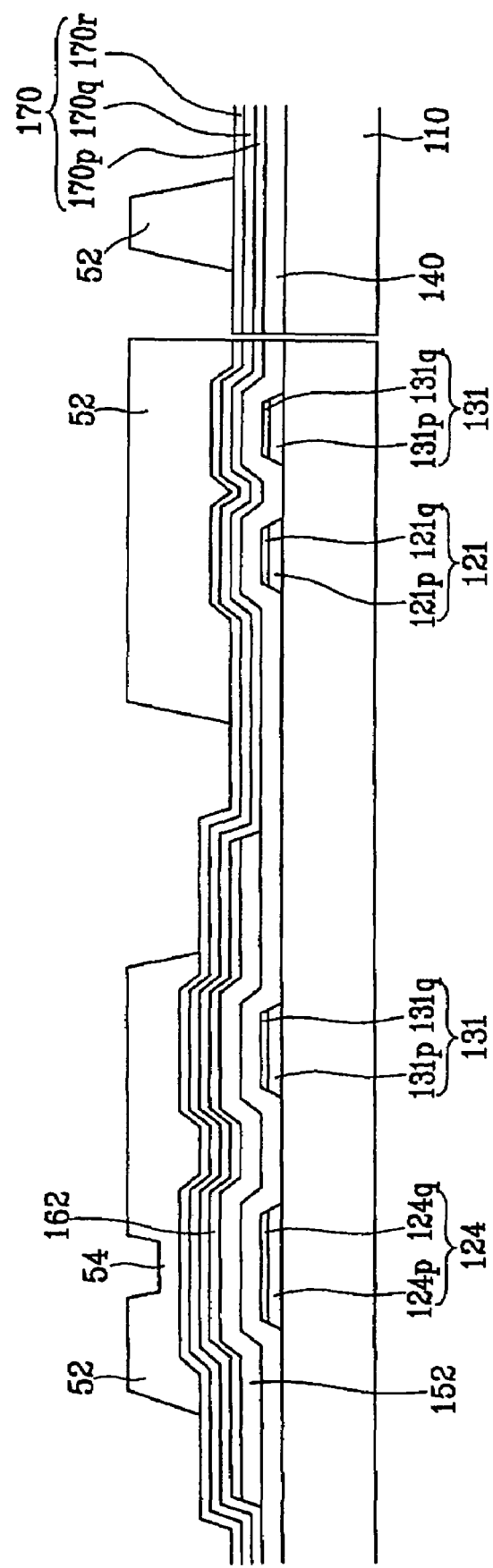
FIG. 18 is a sectional view of the TFT array panel shown in FIG. 16A taken along the line XVIb-XVIb', and shows an operation following the operation shown in FIG. 17.
Figure 19:
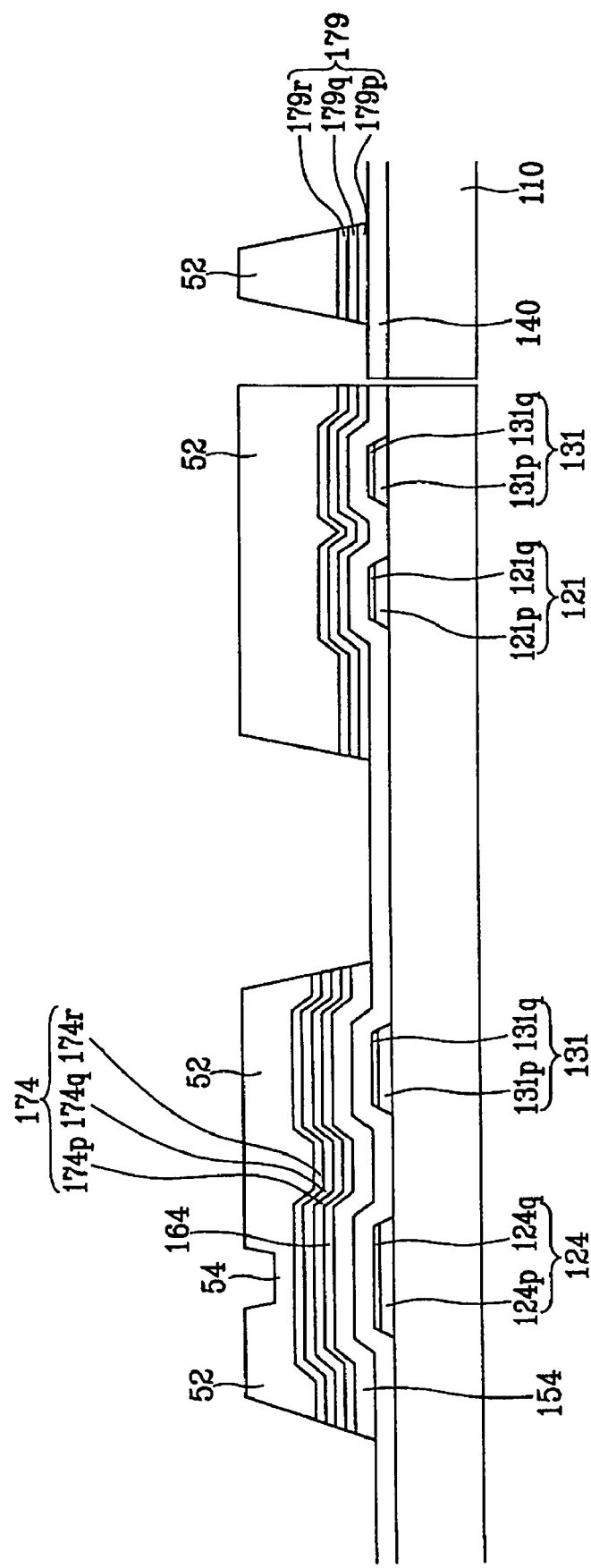
FIG. 19 is a sectional view of the TFT array panel shown in FIG. 16A taken along the line XVIb-XVIb', and shows an operation following the operation shown in FIG. 18B.
Figure 20:
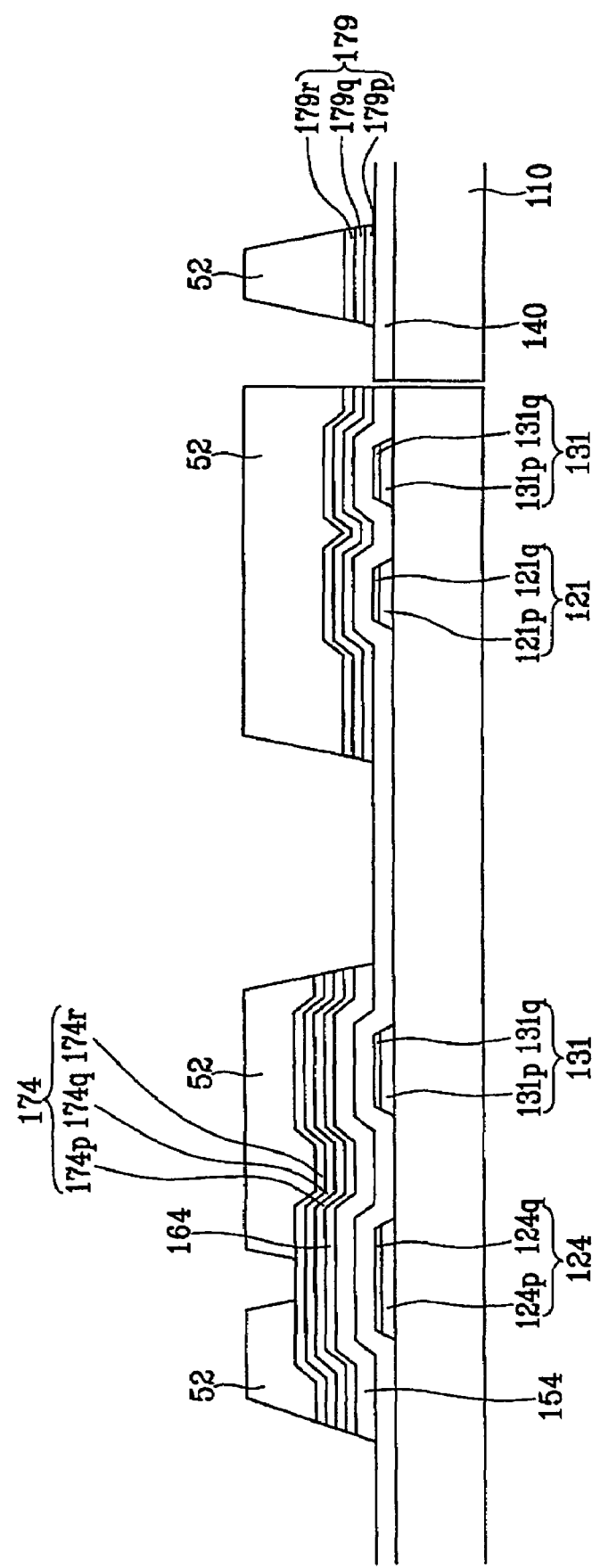
FIG. 20 is a sectional view of the TFT array panel shown in FIG. 16A taken along the line XVIb-XVIb', and shows an operation following the operation shown in FIG. 19.

FIGS. 14A, 16A, 21A and 22A are layout views of the TFT array panel shown in FIG. 13A and FIG. 13B during intermediate operations of a manufacturing method thereof according to an embodiment of the invention. FIG. 14B is a sectional view of the TFT array panel shown in FIG. 4A taken along the line IVb-IVb'. FIG. 15 is a sectional view of the TFT array panel shown in FIG. 14A taken along the line XIVb-XIVb', and shows the operation following the operation shown in FIG. 14B. FIG. 16B is a sectional view of the TFT array panel shown in FIG. 16A taken along the line XVIb-XVIb'. FIG. 17 is a sectional view of the TFT array panel shown in FIG. 16A taken along the line XVIb-XVIb', and shows the operation following the operation shown in FIG. 16B. FIG. 18 is a sectional view of the TFT array panel shown in FIG. 16A taken along the line XVIb-XVIb', and shows the operation following the operation shown in FIG. 17. FIG. 19 is a sectional view of the TFT array panel shown in FIG. 16A taken along the line XVIb-XVIb', and shows the operation following the operation shown in FIG. 18B. FIG. 20 is a sectional view of the TFT array panel shown in FIG. 16A taken along the line XVIb-XVIb', and shows the operation following the operation shown in FIG. 19. FIG. 21B is a sectional view of the TFT array panel shown in FIG. 21A taken along the line XXIb-XXIb'. FIG. 22B is a sectional view of the TFT array panel shown in FIG. 22A taken along the line XXIIb-XXIIb'.

Figure 14A:
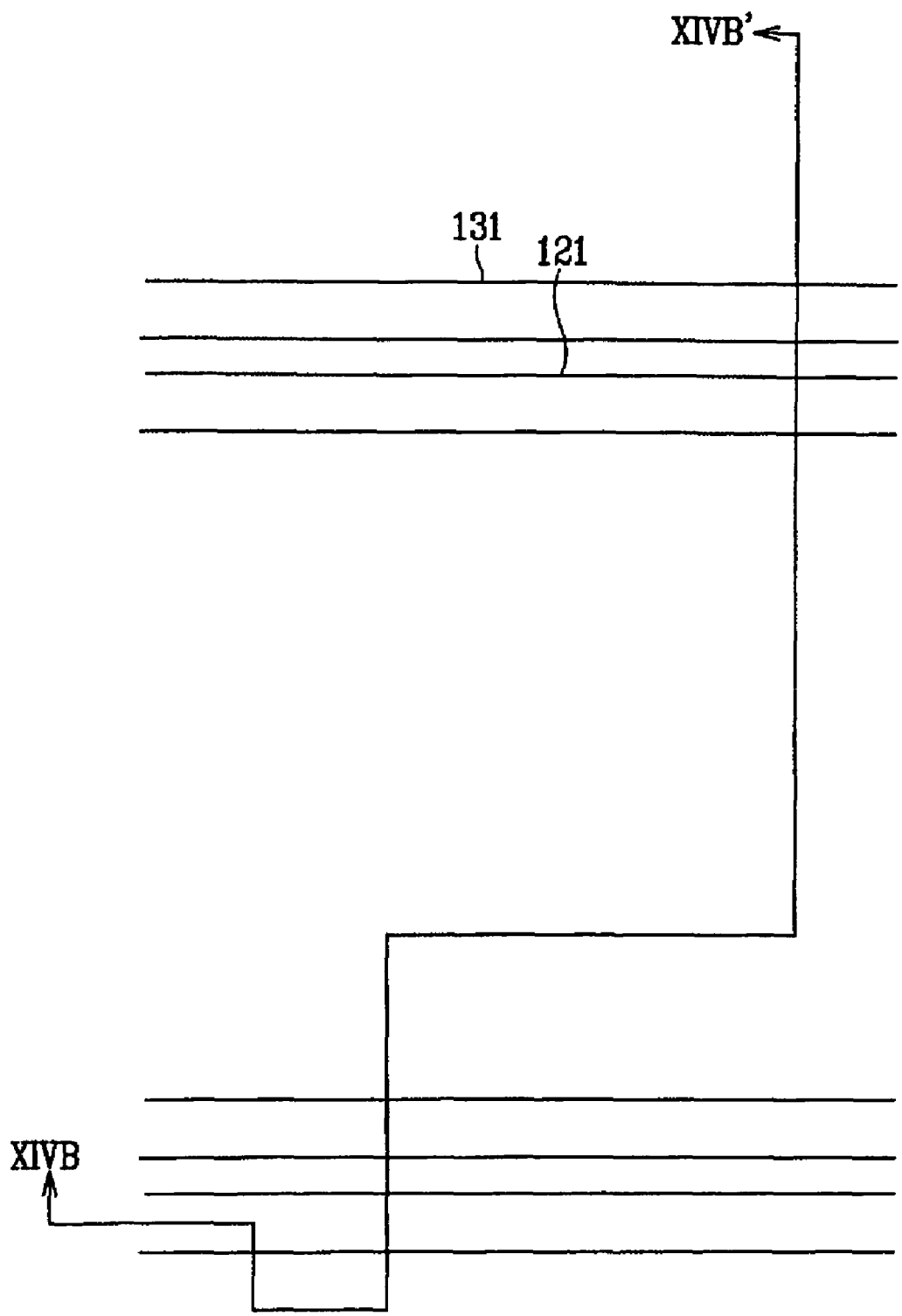
FIGS. 14A, 16A, 21A and 22A are layout views of a TFT array panel shown in FIGS. 13A and 13B during intermediate steps of a manufacturing method thereof according to an embodiment of the invention.
Figure 15:
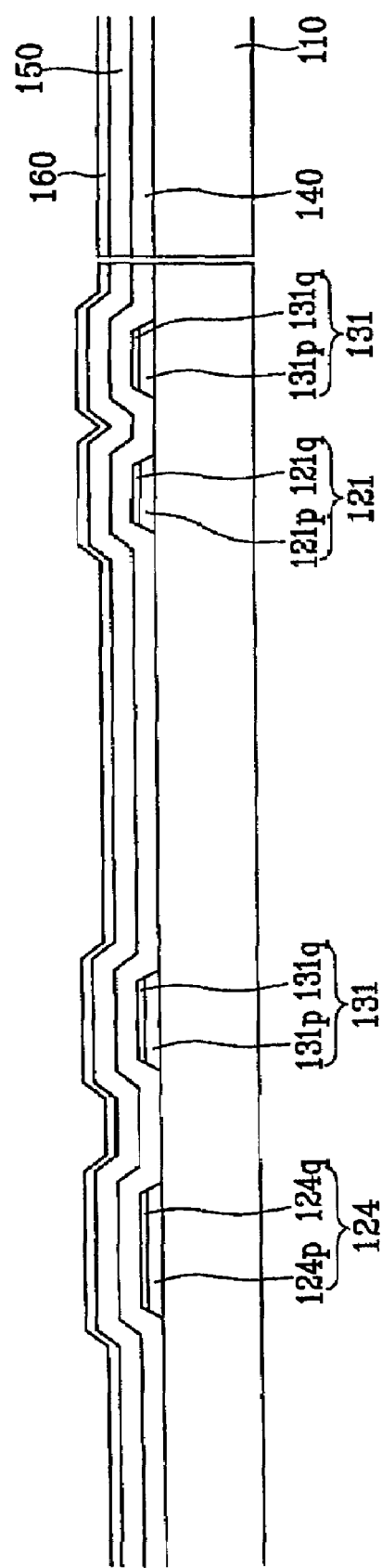
FIG. 15 is a sectional view of the TFT array panel shown in FIG. 14A taken along the line XIVb-XIVb', and shows an operation following the operation shown in FIG. 14B.

As shown in FIG. 14A and FIG. 14B, a metal film including a lower film made of Al or Al alloy and an upper film made of Mo or Mo ally formed, for example, by sputtering and patterning by photo-etching with a photoresist pattern, on the plastic substrate 110 to form a plurality of gate lines 121 including a plurality of gate electrodes 124, a plurality of projections 127, and a plurality of end portions 129, and a plurality of storage electrode lines 131.

Referring to FIG. 15, a gate insulating layer 140, which may be made of an inorganic material, such as of $SiOe_2$ or $SiN_x$, is formed by CVD to cover the gate lines 121 and the storage electrode lines 131. The gate insulating layer 140 may be deposited such that it is between approximately 2,000 Å and 5,000 Å thick, and the gate insulating layer 104 is deposited at a temperature of between approximately 250 and 500 degrees Celsius.

An intrinsic a-Si layer 150 and an extrinsic a-Si layer 160 are deposited on the gate insulating layer 140.

The plastic substrate 110 expands due to heat applied thereto. The amount of expansion depends on a type of plastic material used to form the plastic substrate 110. The plastic substrate 110 also expands during the operations of the deposition of the gate insulating layer 140, deposition of the intrinsic a-Si layer 150, and deposition of the extrinsic a-Si layer 160, because the plastic material has a coefficient of thermal expansion of between approximately 50 ppm/K and 60 ppm/K.

Due to such expansion of the plastic substrate 110, the gate line 121 including the gate electrodes 124, the projections 127 and the end portion 129 deviates from the initial position before heat was applied thereto.

When the extrinsic a-Si layer 150 and the intrinsic a-Si layer 160 are etched near the base on the position of the gate electrode 124, the misalignment between the extrinsic a-Si layer 150, the intrinsic a-Si layer 160, and the gate electrode 124 increases. A channel of thin film transistor may be formed at a predetermined position of the plastic substrate 110.

The extrinsic a-Si layer 150 and the intrinsic a-Si layer 160 may be etched multiple times, for example, two times, to minimize misalignment, which is discussed below.

Figure 16A:
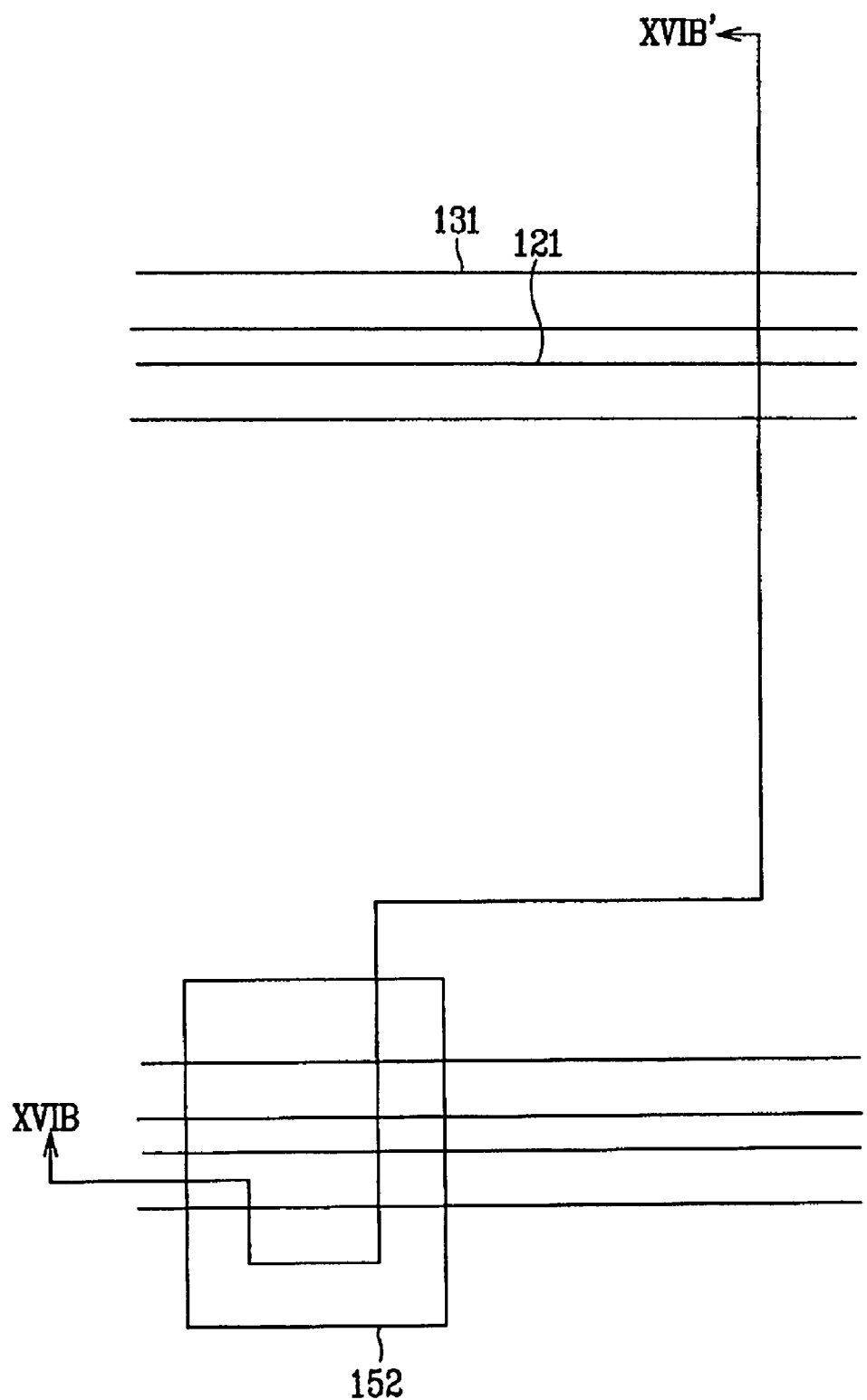
Figure 16B:
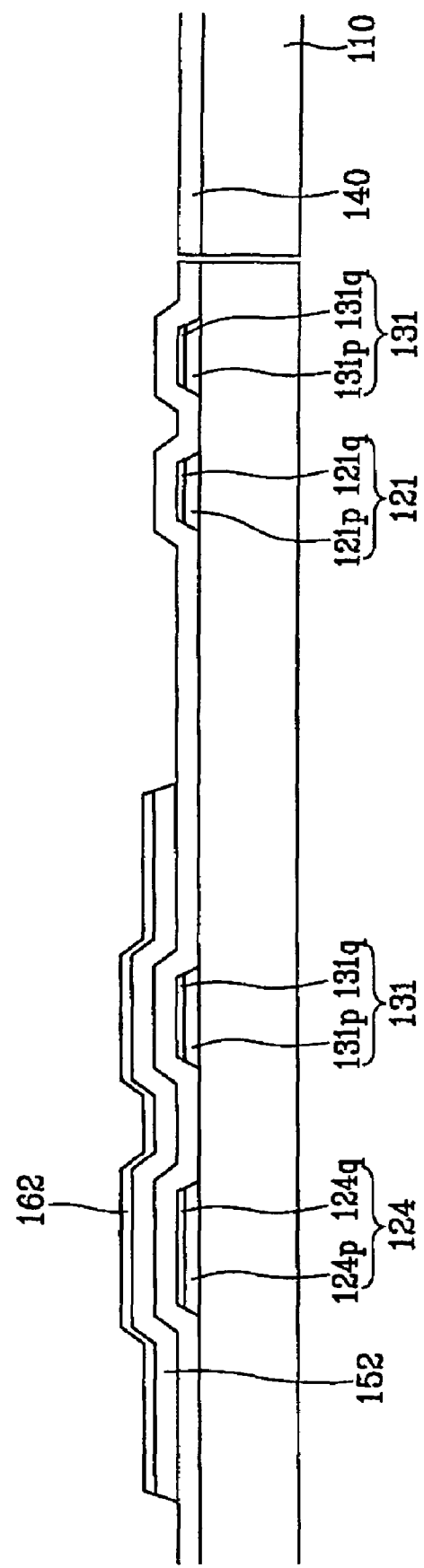
FIG. 16B is a sectional view of the TFT array panel shown in FIG. 16A taken along the line XVIb-XVIb'.

Referring to FIG. 16A and FIG. 16B, the extrinsic a-Si layer 150 and the intrinsic a-Si layer 160 are photo-etched to form a plurality of first extrinsic semiconductors island 162 and a plurality of first intrinsic semiconductor islands 152, respectively, with a predetermined size. The first extrinsic semiconductor islands 162 and the first intrinsic semiconductor islands 152 have sufficient size to cover the initial size of the gate electrode 124 before depositing the extrinsic a-Si layer 150 and the intrinsic a-Si layer 160, and the expanded size of the gate electrode 124 after depositing the extrinsic a-Si layer 150 and the intrinsic a-Si layer 160.

After forming the first extrinsic semiconductor islands 162 and the first intrinsic semiconductor islands 152, the stress applied to the plastic substrate 110 due to the first extrinsic semiconductor islands 162 and the first intrinsic semiconductor islands 152 decreases as compared with the stress applied thereto by the extrinsic a-Si layer 150 and the intrinsic a-Si layer 160 covering the plastic substrate 110, and the plastic substrate 110 is restored to its initial state.

The positions of the gate electrodes 124 are restored to their initial state due to the restoration of the plastic substrate 110.

Referring to FIG. 17, a metal film, which includes a first film 170p having Mo, a second film 170q having Al, and a third film 170r having Mo, is sputtered on the first extrinsic semiconductor islands 162, the first intrinsic semiconductor islands 152, and the gate insulating layer 140.

Referring to FIG. 18, a photoresist that is approximately 1-2 microns thick is coated on the third film 170r. The photoresist is exposed to light through an exposure mask (not shown) and developed to form a photoresist film 52 and 54.

The thickness of the developed photoresist film 52 and 54 depends on a position of the developer photoresist film 52 and 54. For example, the photoresist includes a plurality of first, second, and third portions each having a different thickness. The first portions facing a channel of thin film transistors and the second portions facing the wire are indicated by reference numerals 54 and 52, respectively, and no reference numeral is assigned to the third portions since they have substantially a zero thickness to expose underlying portions of the third film 170r. The thickness ratio of the first portions 54 to the second portions 52 is adjusted depending on the process conditions in the subsequent process steps. For example, the thickness of the first portions 54 may be equal to or less than half of the thickness of the second portions 52.

The position-dependent thickness of the photoresist may be obtained using any of several techniques. For example, the position-dependent thickness may be formed by providing translucent areas, transparent areas, and light blocking opaque areas, on the exposure mask. The translucent areas may have a slit pattern, a lattice pattern, and/or a thin film(s) with intermediate transmittance or intermediate thickness. When using a slit pattern, the width of the slits or the distance between the slits should be less than the resolution of a light exposure used for the photolithography.

Another way to form the position-dependent thickness is to use a reflowable photoresist. Specifically, once a photoresist pattern made of a reflowable material is formed by using a normal exposure mask having only transparent areas and opaque areas, the photoresist may flow onto areas without the photoresist, thereby forming thin portions, e.g., third portions.

The different thickness of the photoresist 52 and 54 enables the underlying layers to be selectively etched when using suitable process conditions.

Referring to FIG. 19, the first film 170p, the second film 170q, and the third film 170r are removed by wet etching or dry etching using the photoresist 52 and 54 to form a plurality of data conductors 174 and expose underlying portions of the first extrinsic semiconductor islands 162 and the first intrinsic semiconductor islands 152. The first semiconductor islands 152 and the first extrinsic semiconductor islands 162 are photo-etched to form a plurality of second intrinsic semiconductor islands 154 and a plurality of second extrinsic semiconductor islands 164.

Referring to FIG. 20, the first portion 54 (shown in FIG. 19) of the photoresist is removed, for example, by ashing, to expose a portion of the conductors 174.

Figure 21A:
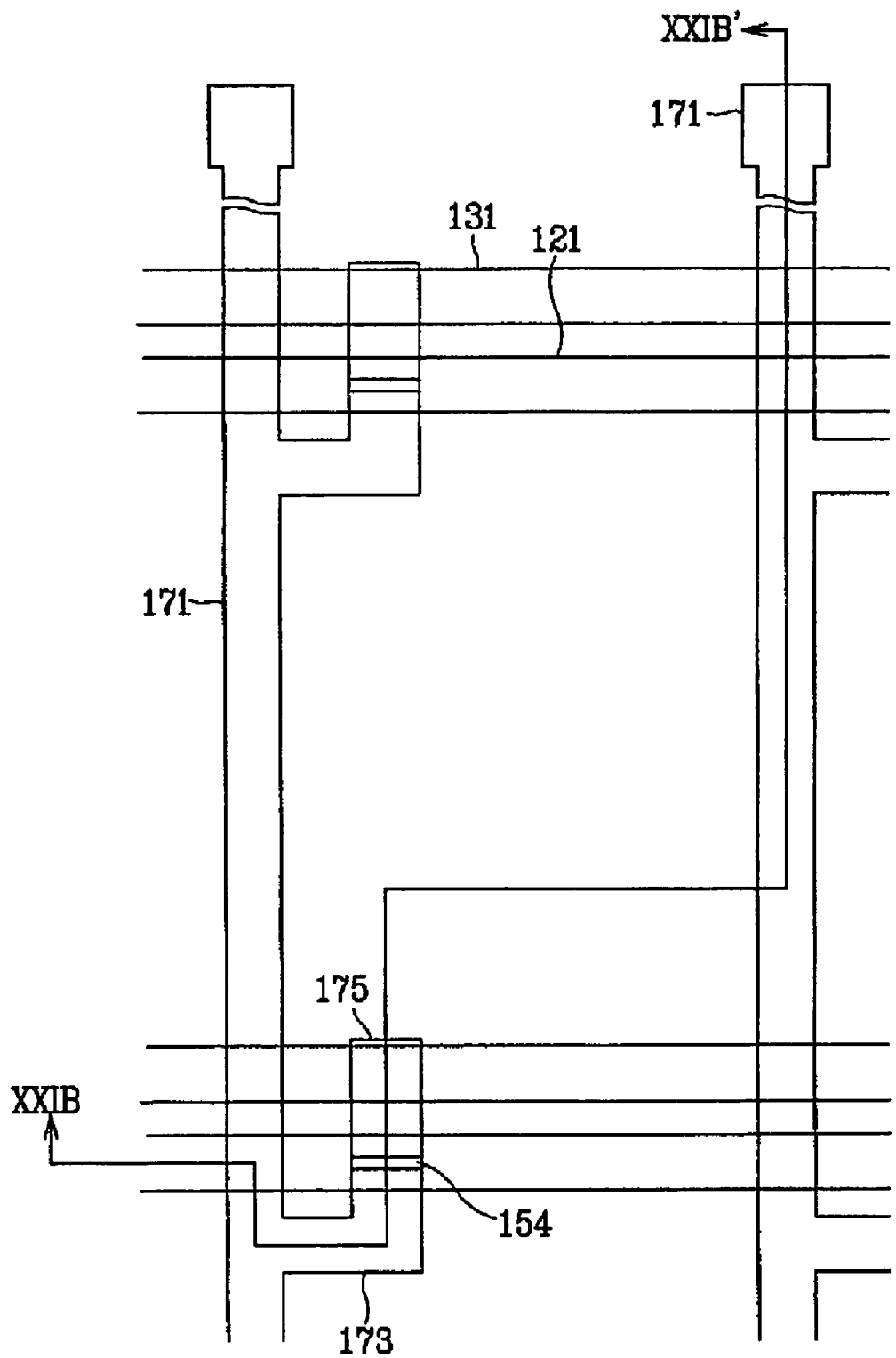
Figure 21B:
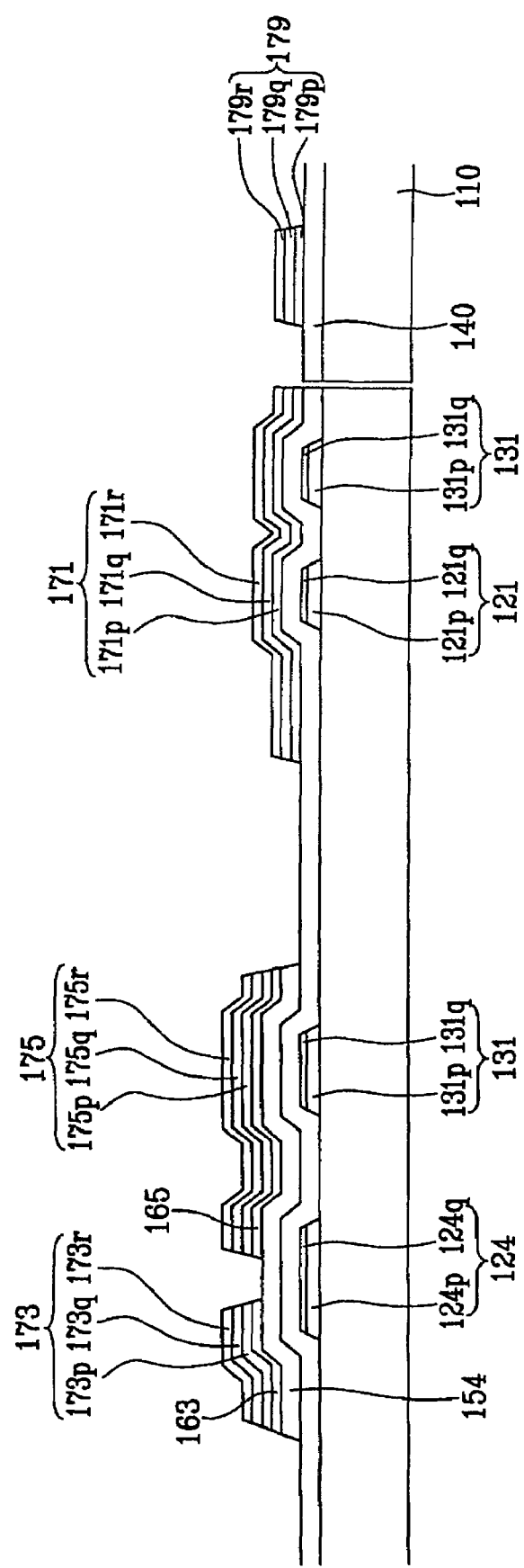
FIG. 21B is a sectional view of the TFT array panel shown in FIG. 21A taken along the line XXIb-XXIb'.

As shown in FIGS. 21A and 21B, the exposed portions of the conductors 174, the second extrinsic semiconductor islands 164 thereunder, and the first portion 52 of the photoresist, are removed.

Each conductor 174 is divided into a data line 171 and a plurality of drain electrodes 175 to be completed. Each second extrinsic semiconductor stripe 164 is divided into a plurality of ohmic contact stripes 163 and ohmic contact islands 165 to be completed.

Top portions of the second semiconductor islands 154 may be removed to reduce thickness. The second portions 52 of the photoresist are etched to a predetermined thickness.

As above described, the first extrinsic semiconductor islands 162 and the first intrinsic semiconductor islands 152 are formed with sufficient size in consideration of the expansion, then the second semiconductor islands 154 and the second extrinsic semiconductor islands 164 are photo-etched at a predetermined position after restoring the plastic substrate 110 at an initial state in the normal temperature. The misalignment between the gate electrodes 124 and the second semiconductor islands 154 may be minimized.

Figure 22A:
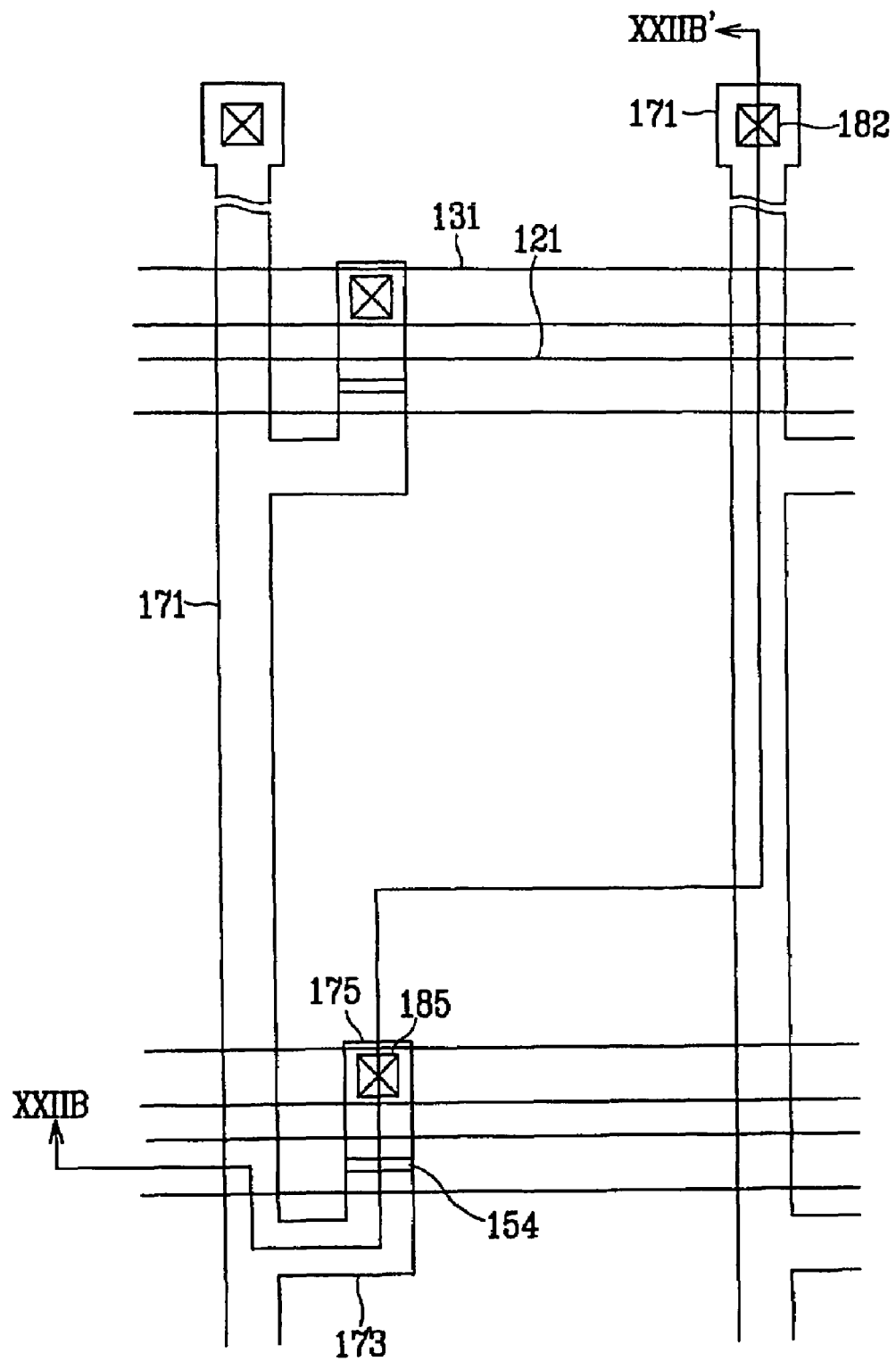

Referring to FIGS. 22A and 22B, a lower passivation layer 180p and an upper passivation layer 180q covering the data lines 171 and the drain electrodes 175 are formed. The lower passivation layer 180p may be a thickness between approximately 500 and 2,000 Å, and the thickness of the upper passivation layer 180q may be between approximately 2-5 microns.

The upper passivation layer 180q and the lower passivation layer 180p are then etched to form a plurality of contact holes 182 and 185.

Referring to FIG. 13A and FIG. 13B, a conductive layer may be deposited, for example, by sputtering, and is etched using the photoresist to form a plurality of pixel electrodes 190 and a plurality of contact assistants 82.

The upper passivation layer 180q made of an organic material may minimize cross-talk by counterbalancing misalignment between data lines 171, the drain electrodes 175, the storage electrode capacitors 177, and the pixel electrode 190.

As above described, the expanded plastic substrate may be restored to an initial state at normal temperature and the misalignment between the gate electrodes and the semiconductor may be minimized on the restored plastic substrate by patterning the semiconductor two times, thereby forming the channel portion of thin film transistor at an accurate position.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a flexible display, comprising:
   forming a gate line comprising a gate electrode on a substrate;
   depositing a gate insulating layer covering the gate line;
   depositing a semiconductor layer covering the gate insulating layer;
   firstly etching the semiconductor layer;
   secondly etching the semiconductor layer;
   forming a data line including a source electrode and a drain electrode on the semiconductor layer; and
   forming a pixel electrode connected with the drain electrode,
   wherein the substrate expands when depositing the gate insulating layer and the semiconductor layer and the expanded substrate is restored to an initial size after firstly etching the semiconductor layer.

2. The method of claim 1, wherein after firstly etching the semiconductor layer, the semiconductor layer covers the gate electrode.

3. The method of claim 1, wherein after secondly etching the semiconductor layer, the semiconductor layer covers the gate electrode on the restored substrate.

4. The method of claim 1, wherein after firstly and secondly etching the semiconductor layer, the semiconductor layer is an island shape.

5. The method of claim 1, further comprising:
   forming a passivation layer before forming the pixel electrode.

6. The method of claim 5, wherein the passivation layer comprises:
   a first passivation layer made of an inorganic material; and
   a second passivation layer made of an organic material.

7. The method of claim 1, wherein the semiconductor layer comprises an intrinsic amorphous silicon layer and an extrinsic amorphous silicon layer.

8. The method of claim 1, wherein the substrate is a plastic substrate.

9. The method of claim 8, wherein the plastic substrate comprises:
   a layer made of at least one material selected from a group consisting of polyacrylate, polyethylene-terephthalate, polyethylene-naphthalate, polycarbonate, polyarylate, polyetherimide, polyehtersulfone, and polyimides.

10. The method of claim 1, further comprising:
    forming a barrier layer on the substrate.

11. The method of claim 1, further comprising:
    forming a color filter below the pixel electrode.

12. The method of claim 1, wherein a photoresist including a plurality of portions having varying thickness is used for secondly etching the semiconductor layer and forming a data line including a source electrode and a drain electrode on the semiconductor layer.

13. The method of claim 12, wherein a portion of the photoresist faces a portion between the source electrode and the drain electrode, and wherein another portion of the photoresist faces the data line and the drain electrode.

14. A method for manufacturing a flexible display, comprising:

forming a gate electrode on a substrate;

depositing a gate insulating layer on the gate electrode;

depositing a semiconductor layer on the gate insulating layer;

patterning the semiconductor layer to form a semiconductor member comprising a marginal portion, the marginal portion disposed around a boundary of the semiconductor member;

removing the marginal portion of the semiconductor member;

forming a source electrode and a drain electrode on the semiconductor member; and forming a pixel electrode connected to the drain electrode.

15. The method of claim 14, wherein the substrate expands when depositing the gate insulating layer and the semiconductor layer and the expanded substrate is restored to an initial size after patterning the semiconductor layer.

16. The method of claim 15, wherein a size of the marginal portion of the semiconductor member is determined in consideration of thermal expansion of the substrate.

17. The method of claim 14, wherein the formation of the source electrode and the drain electrode is performed after removing the marginal portion.

18. The method of claim 14, wherein the formation of the source electrode and the drain electrode comprises:

depositing a conductive layer after patterning the semiconductor layer and before removing the marginal portion; and patterning the conductive layer to form the source electrode and the drain electrode, wherein the patterning of the conductive layer and the removal of the marginal portion are performed simultaneously.

19. The method of claim 14, wherein the semiconductor layer comprises an intrinsic amorphous silicon layer and an extrinsic amorphous silicon layer.

* * * * *